United States Patent
Tanaka

(10) Patent No.: US 10,388,543 B2
(45) Date of Patent: Aug. 20, 2019

(54) SUBSTRATE PROCESSING DEVICE, SUBSTRATE PROCESSING METHOD, AND ULTRAVIOLET IRRADIATOR SELECTING METHOD

(71) Applicant: SCREEN Holdings Co., Ltd., Kyoto (JP)

(72) Inventor: Takayoshi Tanaka, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 15/901,183

(22) Filed: Feb. 21, 2018

(65) Prior Publication Data

US 2018/0286706 A1 Oct. 4, 2018

(30) Foreign Application Priority Data

Mar. 28, 2017 (JP) ................. 2017-063677

(51) Int. Cl.
*H01L 21/67* (2006.01)
*H01L 21/26* (2006.01)
(Continued)

(52) U.S. Cl.
CPC .. *H01L 21/67034* (2013.01); *H01L 21/02046* (2013.01); *H01L 21/02057* (2013.01);
(Continued)

(58) Field of Classification Search
CPC ......... H01L 21/67115; H01L 21/02046; H01L 21/02057; H01L 21/0217; H01L 21/02274; H01L 21/2686; H01L 21/3185; H01L 21/67034; H01L 21/67248; H01L 21/68764; H01L 51/001; H01L 51/002; H01L 51/0037; H01L 51/0059;
(Continued)

(56) References Cited

U.S. PATENT DOCUMENTS 6,849,308 B1 * 2/2005 Speakman ................ G03F 7/16
427/422
2005/0016462 A1 * 1/2005 Yannazaki .............. C23C 14/12
118/726
(Continued)

FOREIGN PATENT DOCUMENTS

JP 2011-204944 A 10/2011
WO WO 01/35451 A1 5/2001
(Continued)

OTHER PUBLICATIONS

Office Action dated May 14, 2019 and Search Report in counterpart Taiwanese Patent Application No. 107106077 with Japanese and partial English translation based on the Japanese translation.

*Primary Examiner* — David A Vanore
(74) *Attorney, Agent, or Firm* — Ostrolenk Faber LLP

(57) ABSTRACT

A substrate processing device includes substrate holder, a plurality of ultraviolet irradiators, and controller. The substrate holder holds a substrate. The ultraviolet irradiators irradiate gaps between a plurality of fine structures formed on the substrate held by the substrate holder with ultraviolet rays in spectra different from each other. The controller controls the plurality of ultraviolet irradiators.

20 Claims, 21 Drawing Sheets

(51) Int. Cl.
*H01L 21/268* (2006.01)
*H01L 21/02* (2006.01)
*H01L 21/687* (2006.01)

(52) U.S. Cl.
CPC .... *H01L 21/2686* (2013.01); *H01L 21/67028* (2013.01); *H01L 21/67115* (2013.01); *H01L 21/68742* (2013.01); *H01L 21/68764* (2013.01)

(58) Field of Classification Search
CPC .............. H01L 51/0062; H01L 51/007; H01L 51/0077; H01L 51/0078; H01L 51/0081; H01L 51/0085; H01L 51/56; H01L 22/24; G01N 21/55; H01J 61/34; H01J 65/042
USPC ............ 118/726, 723 VE; 134/1.1; 250/216, 250/455.11, 492.1, 504 R; 427/595
See application file for complete search history.

(56) References Cited

U.S. PATENT DOCUMENTS

| | | | |
|---|---|---|---|
| 2005/0263719 A1* | 12/2005 | Ohdaira | C23C 16/401 250/492.1 |
| 2006/0216950 A1* | 9/2006 | Matsuura | C23C 16/345 438/775 |
| 2007/0020784 A1* | 1/2007 | Timans | G01J 5/0003 438/16 |
| 2008/0268374 A1 | 10/2008 | Tashiro et al. | |
| 2014/0263983 A1* | 9/2014 | Hirokubo | G02B 26/001 250/216 |

FOREIGN PATENT DOCUMENTS

| WO | WO 2004/111725 A2 | 12/2004 |
|---|---|---|
| WO | WO 2011/096365 A1 | 8/2011 |

\* cited by examiner

F I G. 8
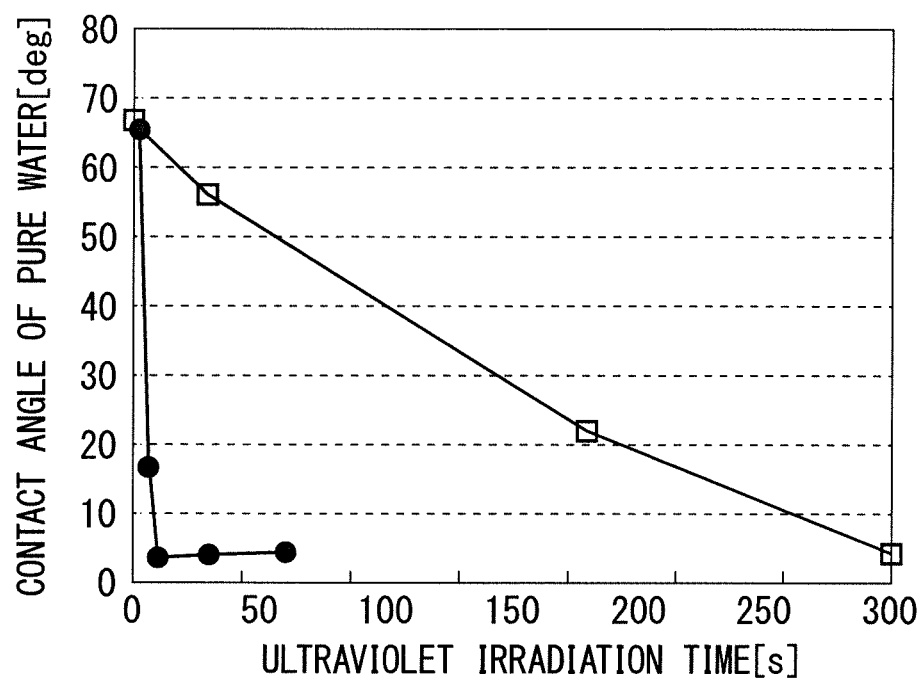

F I G. 1 8
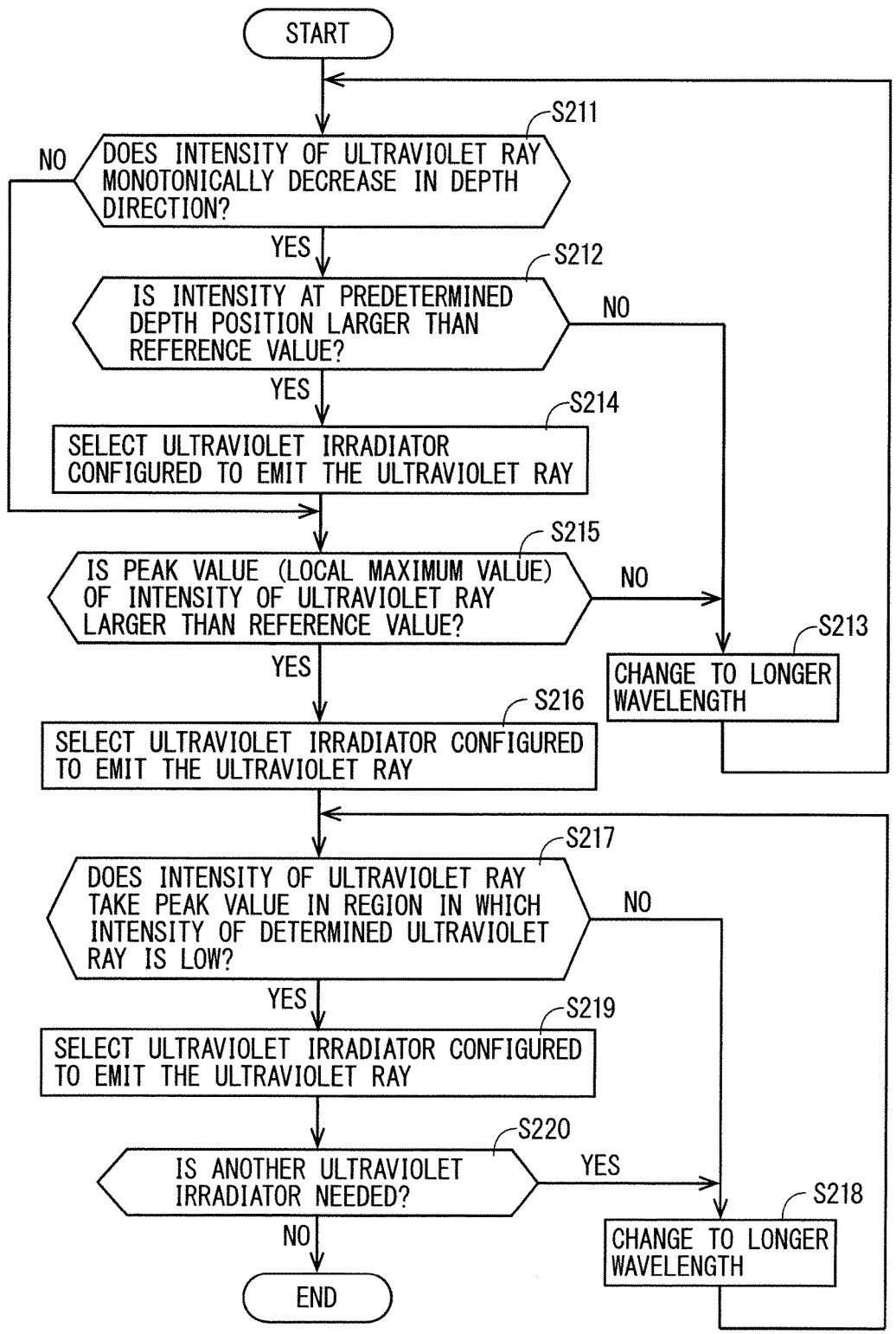

| WIDTH OF GAP BETWEEN FINE STRUCTURES [nm] | WAVELENGTH | | | | |
|---|---|---|---|---|---|
| | $\lambda a$ | $\lambda b$ | $\lambda c$ | $\lambda d$ | $\lambda e$ |
| 10 (0~15) | × | × | ○ | ○ | ○ |
| 20 (15~30) | × | ○ | △ | ○ | △ |
| 40 (30~) | ○ | ○ | △ | △ | △ |

POSITION IN DEPTH DIRECTION OF GAP BETWEEN ADJACENT FINE STRUCTURES P1[nm]

FIG. 26

| DEPTH OF GAP BETWEEN FINE STRUCTURES [nm] | WAVELENGTH | | | | |
|---|---|---|---|---|---|
| | λa | λb | λc | λd | λe |
| 200 (150~) | × | × | ○ | ○ | ○ |
| 100 (75~150) | × | ○ | △ | ○ | △ |
| 50 (0~75) | ○ | △ | △ | △ | ○ |

SUBSTRATE PROCESSING DEVICE, SUBSTRATE PROCESSING METHOD, AND ULTRAVIOLET IRRADIATOR SELECTING METHOD

BACKGROUND OF THE INVENTION

Field of the Invention

The present invention relates to a substrate processing device, a substrate processing method, and an ultraviolet irradiator selecting method, and particularly relates to a technology of disassembling and removing an organic substance on a substrate by ultraviolet rays.

Description of the Background Art

In a conventional process of manufacturing a semiconductor substrate (hereinafter simply referred to as a "substrate"), a substrate processing device has been used to provide the substrate with various kinds of processing. For example, etching processing (what is called wet etching) is performed on a surface of the substrate, on which a resist pattern is formed, by supplying drug solution to the substrate. After this etching processing, rinse processing and dry processing are further performed. In the rinse processing, pure water is supplied to the substrate to wash away the drug solution on the surface. In the dry processing, the pure water on the surface is removed.

When a large number of minute pattern elements (also called fine structures) are formed on the surface of the substrate and the rinse processing by using pure water and the dry processing are sequentially performed, the surface tension of the pure water acts on the fine structures and potentially collapses the fine structures through drying. The collapse is more likely to occur when each fine structure has a narrower width and thus a higher aspect ratio, and each gap between the fine structures is narrower.

To avoid the collapse, disclosed water-repellent processing forms a water-repellent film (organic substance) by forming a water-repellent (hydrophobic) surface of the fine structure. In the water-repellent processing, silylation agent is often used as water-repellent agent and mixed with an activator to improve a water-repellent effect thereof.

The water-repellent film is unnecessary after the dry processing. Thus, a method of removing the water-repellent film has been disclosed conventionally. For example, Japanese Patent Application Laid-Open No. 2011-204944 discloses a substrate processing device configured to disassemble and remove the organic substance on the substrate. The substrate processing device includes ultraviolet irradiation means. In the disclosure of Japanese Patent Application Laid-Open No. 2011-204944, the ultraviolet irradiation means irradiates the substrate with ultraviolet rays to disassemble and remove the organic impurity on the substrate.

In the disclosure of Japanese Patent Application Laid-Open No. 2011-204944, in a viewpoint of organic substance disassembly, it is preferable to employ an ultraviolet ray having high photon energy, in other words, an ultraviolet ray having a short wavelength. This is because an ultraviolet ray having higher photon energy can disconnect a larger number of kinds of molecular binding and immediately disassemble the organic substance.

However, a recent pattern on a substrate has been refined. In other words, the width of each fine structure and each gap between the fine structures have been narrowed. An ultraviolet ray having a shorter wavelength is more unlikely to penetrate into the narrow gap between the fine structures. This is because an ultraviolet ray having a short wavelength is unlikely to diffract. When an ultraviolet ray is unlikely penetrate into the gap, the ultraviolet ray is unlikely to act on an organic substance existing in the gap. This leads to insufficient removal of the organic substance.

The intensity of an ultraviolet ray can vary in the gap between the fine structures in the depth direction (height direction of the fine structures) thereof. This is because an ultraviolet ray diffracts, reflects, and interferes in the gap between the fine structures. The organic substance is unlikely to be disassembled and is insufficiently removed in a region in which the intensity of an ultraviolet ray decreases in the gap.

SUMMARY

The present invention is directed to a substrate processing device configured to irradiate a substrate with ultraviolet rays.

A substrate processing device according to a first aspect includes substrate holder, a plurality of ultraviolet irradiators, and controller. The substrate holder holds a substrate. The plurality of ultraviolet irradiators irradiate each gap between a plurality of fine structures formed on the substrate held by the substrate holder with ultraviolet rays in spectra different from each other. The controller controls the plurality of ultraviolet irradiators.

A substrate processing device according to a second aspect is the substrate processing device according to the first aspect in which the plurality of ultraviolet irradiators include first ultraviolet irradiator and second ultraviolet irradiator. Intensity of first ultraviolet ray output from the first ultraviolet irradiator varies in a first period in a depth direction in the gap between the fine structures. Intensity of second ultraviolet ray output from the second ultraviolet irradiator varies in a second period in the depth direction in the gap between the fine structures. The intensity of the second ultraviolet ray takes a peak value in a first region having a center at a position in the depth direction where the intensity of the first ultraviolet ray takes a bottom value and having a width in the depth direction equal to half of the first period.

A substrate processing device according to a third aspect is the substrate processing device according to the second aspect in which the plurality of ultraviolet irradiators include third ultraviolet irradiator. Intensity of third ultraviolet ray output from the third ultraviolet irradiator varies in a third period in the depth direction in the gap between the fine structures. The intensity of the second ultraviolet ray takes a peak value in a region in which the first region overlaps with a second region having a center at a position in the depth direction where the intensity of the third ultraviolet ray takes a bottom value and having a width in the depth direction equal to half of the third period.

A substrate processing device according to a fourth aspect is the substrate processing device according to the first aspect in which the number of the plurality of ultraviolet irradiators is three or more. The controller includes acquisition unit and selector. The acquisition unit acquires information that changes in accordance with at least one of width and depth of the gap between the fine structures. The selector performs, based on the information, a selection operation to select whether ultraviolet rays are to be emitted by two or more of the plurality of ultraviolet irradiators.

A substrate processing device according to a fifth aspect is the substrate processing device according to the fourth aspect, the selector selects, based on the information, ultraviolet irradiator configured to emit an ultraviolet ray having a shorter wavelength as the gap between the fine structures is wider or shallower.

A substrate processing device according to a sixth aspect is the substrate processing device according to the fifth aspect in which the plurality of ultraviolet irradiators include first ultraviolet irradiator configured to emit a first ultraviolet ray in a spectrum including a first peak wavelength, and second ultraviolet irradiator configured to emit a second ultraviolet ray in a spectrum including a second peak wavelength longer than the first peak wavelength. The selector selects the first ultraviolet irradiator and the second ultraviolet irradiator based on the information. Intensity of the first ultraviolet ray varies in a first period in the depth direction in the gap between the fine structures. Intensity of the second ultraviolet ray takes a peak value in a region having a center at a position in the depth direction where the intensity of the first ultraviolet ray takes a bottom value and having a width in the depth direction equal to half of the first period.

A substrate processing device according to a seventh aspect is the substrate processing device according to the fifth or sixth aspect in which the plurality of ultraviolet irradiators include third ultraviolet irradiator configured to emit a third ultraviolet ray in a spectrum including a third peak wavelength longer than the second peak wavelength. The selector selects, based on first information, the first ultraviolet irradiator and the second ultraviolet irradiator but not the third ultraviolet irradiator. The selector selects the second ultraviolet irradiator and the third ultraviolet irradiator based on second information for which the gap between the fine structures is narrower or deeper than for the first information.

A substrate processing device according to an eighth aspect is the substrate processing device according to any one of the first to seventh aspects in which a distance between each piece of ultraviolet irradiator and the substrate holder is shorter for a longer peak wavelength of an ultraviolet ray emitted by the ultraviolet irradiator.

A substrate processing device according to a ninth aspect is the substrate processing device according to any one of the first to eighth aspects in which the controller controls the plurality of ultraviolet irradiators so that irradiation durations of the plurality of ultraviolet irradiators at least partially overlap with each other.

A substrate processing device according to a tenth aspect is the substrate processing device according to any one of the first to ninth aspects in which the plurality of ultraviolet irradiators face to the substrate held by the substrate holder with a space interposed therebetween. The substrate processing device further includes gas supplying unit configured to supply inert gas to the space.

The substrate processing device according to an eleventh aspect is the substrate processing device according to any one of the first to tenth aspects in which each piece of ultraviolet irradiator irradiates an entire surface of the substrate held by the substrate holder with an ultraviolet ray.

A substrate processing device according to a twelfth aspect is the substrate processing device according to any one of the first to eleventh aspects further including movement unit configured to move the substrate holder relative to the plurality of ultraviolet irradiators in a horizontal direction.

A substrate processing device according to a thirteenth aspect is the substrate processing device according to any one of the first to twelfth aspects further including rotation unit configured to rotate the substrate holder about a rotational axis orthogonal to a surface of the substrate.

A substrate processing device according to a fourteenth aspect is the substrate processing device according to any one of the first to thirteenth aspects in which the fine structures have an aspect ratio of 3.5 or higher, a pitch of 50 nm or shorter, or an interval of 40 nm or shorter.

A substrate processing method according to a fifteenth aspect includes holding, by substrate holder, a substrate, and irradiating, by a plurality of plurality of ultraviolet irradiators, each gap between a plurality of fine structures formed on the substrate held by the substrate holder with ultraviolet rays in spectra different from each other.

An ultraviolet irradiator selecting method according to a sixteenth aspect is an ultraviolet irradiator selecting method in a substrate processing device including a substrate holder configured to hold a substrate on which a plurality of fine structures are formed and a plurality of plurality of ultraviolet irradiators configured to irradiate each gap between the fine structures of the substrate with ultraviolet rays. The method includes a first process of selecting first ultraviolet irradiator configured to emit a first ultraviolet ray capable of penetrating into the gap between the fine structures, and a second process of selecting second ultraviolet irradiator configured to emit a second ultraviolet ray having a peak wavelength longer than a peak wavelength of the first ultraviolet ray and compensating intensity insufficiency in a region in which intensity of the first ultraviolet ray is insufficient in the gap between the fine structures.

An ultraviolet irradiator selecting method according to a seventeenth aspect is the ultraviolet irradiator selecting method according to the sixteenth aspect in which, in the first process, the first ultraviolet irradiator is selected when the intensity of the first ultraviolet ray periodically varies in a depth direction in the gaps between the fine structures and it is determined that a minimum peak value among at least one peak value of the intensity of the first ultraviolet ray is larger than a reference value.

An ultraviolet irradiator selecting method according to an eighteenth aspect is the ultraviolet irradiator selecting method according to the seventeenth aspect in which, in the second process, the second ultraviolet irradiator is selected when it is determined that intensity of the second ultraviolet ray takes a peak value in a region having a center at a position in the depth direction where the intensity of the first ultraviolet ray takes a bottom value and having a width in the depth direction equal to half of the intensity of the first ultraviolet ray.

An ultraviolet irradiator selecting method according to a nineteenth aspect is the ultraviolet irradiator selecting method according to the eighteenth aspect in which the second ultraviolet irradiator is selected but the third ultraviolet irradiator is not selected when the intensity of the second ultraviolet ray and intensity of a third ultraviolet ray emitted by third ultraviolet irradiator and having a peak wavelength longer than the peak wavelength of the second ultraviolet ray both take peak values in the region.

An ultraviolet irradiator selecting method according to a twentieth aspect is the ultraviolet irradiator selecting method according to the sixteenth aspect further including a third process of selecting the first ultraviolet irradiator when, in the first process, the intensity of the first ultraviolet ray monotonically decreases in the depth direction and it is determined that the intensity of the first ultraviolet ray at a predetermined depth position is larger than a reference value.

In the substrate processing device according to the first and fourteenth aspects and the substrate processing method according to the fifteenth aspect, the plurality of ultraviolet irradiators irradiate the surface of the substrate with ultraviolet rays in spectra different from each other. In other words, the ultraviolet rays output from the plurality of ultraviolet irradiators have peak wavelengths different from each other.

The intensity of each ultraviolet ray periodically varies in the depth direction of the gap between the fine structures. This is because the ultraviolet ray diffracts, reflects, and interferes in the gap between the fine structures. The period of the variation depends on peak wavelengths, and accordingly, the periods of the ultraviolet rays are different from each other. Thus, in a region in which the intensity of a first ultraviolet ray having a first peak wavelength is low, there is a second ultraviolet ray having a second peak wavelength with high intensity. In other words, insufficiency of the intensity of the first ultraviolet ray in the region can be compensated by the intensity of the second ultraviolet ray. Accordingly, an organic substance can be more effectively disassembled by the second ultraviolet ray in a region in which it is difficult to disassemble the organic substance by the first ultraviolet ray only.

As described above, the present substrate processing device can disassemble an organic substance by acting ultraviolet rays in a wider range.

In the substrate processing device according to the second aspect, the second ultraviolet ray takes a peak value near the position where the first ultraviolet ray takes a bottom value. Thus, insufficiency of the intensity of the first ultraviolet ray can be more appropriately compensated by the second ultraviolet ray.

In the substrate processing device according to the third aspect, intensity insufficiency can be compensated by the second ultraviolet ray in a region in which the intensities of the first ultraviolet ray and the third ultraviolet ray are insufficient.

In the substrate processing device according to the fourth aspect, ultraviolet irradiator can be selected in accordance with the width or depth of the gap between the fine structures.

In the substrate processing device according to the fifth aspect, when the gap between the fine structures is wide or narrow, an ultraviolet ray having a shorter peak wavelength is employed. This ultraviolet ray having a short peak wavelength is more likely to penetrate into a wider or narrower gap. In addition, the ultraviolet ray having a short peak wavelength can disconnect a larger number of kinds of molecular binding, thereby immediately and thus more effectively disassembling an organic substance.

In the substrate processing device according to the sixth aspect, the second ultraviolet ray takes a peak value near a depth position where the first ultraviolet ray takes a bottom value. Thus, insufficiency of the intensity of the first ultraviolet ray in the gap between the fine structures on the substrate can be more appropriately compensated by the second ultraviolet ray.

In the substrate processing device according to the seventh aspect, when the gap between the fine structures is wide or narrow, the first ultraviolet irradiator and the second ultraviolet irradiator that are configured to emit ultraviolet rays having shorter peak wavelengths are selected. Accordingly, the organic substance can be more effectively disassembled. In addition, the third ultraviolet irradiator is not selected, and thus power consumption by the third ultraviolet irradiator can be avoided.

In the substrate processing device according to the eighth aspect, in a viewpoint of wavelength, an ultraviolet having a longer wavelength removes the organic substance at a slower speed. Typically, the intensity of an ultraviolet ray decreases with the distance from ultraviolet irradiator. According to the eighth aspect, the distance between the ultraviolet irradiator and the substrate is shorter for a longer peak wavelength. Thus, the organic substance can be more effectively removed by an ultraviolet ray having a long peak wavelength.

In the substrate processing device according to the ninth aspect, the throughput of organic substance removal processing can be improved.

In the substrate processing device according to the tenth aspect, the concentration of oxygen in the space between the ultraviolet irradiator and the substrate can be reduced by inert gas. Since oxygen absorbs ultraviolet rays, the intensity of an ultraviolet ray on the substrate can be increased by reducing the concentration of oxygen.

In the substrate processing device according to the eleventh aspect, the substrate can be irradiated with ultraviolet rays in a wide range.

In the substrate processing device according to the twelfth aspect, when the entire surface of the substrate cannot be irradiated with ultraviolet rays by the ultraviolet irradiator, the substrate can be moved so that the entire surface of the substrate is irradiated with ultraviolet rays.

In the substrate processing device according to the thirteenth aspect, the substrate can be uniformly irradiated with ultraviolet rays.

In the ultraviolet irradiator selecting method according to the sixteenth aspect, the organic substance can be more effectively disassembled by the second ultraviolet ray in a region in which it is difficult to disassemble the organic substance by the first ultraviolet ray only.

In the ultraviolet irradiator selecting method according to the seventeenth aspect, an ultraviolet ray capable of penetrating into the gap between the fine structures appropriately can be employed as the first ultraviolet ray.

In the ultraviolet irradiator selecting method according to the eighteenth aspect, the second ultraviolet ray takes a peak value near a position where the first ultraviolet ray takes a bottom value. Thus, insufficiency of the intensity of the first ultraviolet ray can be more appropriately compensated by the second ultraviolet ray.

In the ultraviolet irradiator selecting method according to the nineteenth aspect, when the second and third ultraviolet rays both take peak values in a region in which the intensity of the first ultraviolet ray is insufficient, the second ultraviolet irradiator having a short peak wavelength is selected, but the third ultraviolet irradiator is not selected. Accordingly, the second ultraviolet irradiator, which is more suitable for disassembling the organic substance, can be selected while power consumption by the third ultraviolet irradiator is avoided.

In the ultraviolet irradiator selecting method according to the twentieth aspect, an ultraviolet ray capable of penetrating into the gap between the fine structures appropriately can be employed as the first ultraviolet ray.

These and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a graph schematically illustrating an exemplary relation between an ultraviolet irradiation time and the contact angle of pure water.

FIG. 18 is a flowchart illustrating an exemplary ultraviolet irradiator selecting method;

FIG. 26 is a diagram illustrating an exemplary relation between the depth of each gap between fine structures of a substrate and the wavelength of an ultraviolet ray incident on the substrate.

DESCRIPTION OF THE PREFERRED EMBODIMENTS

Figure 1:
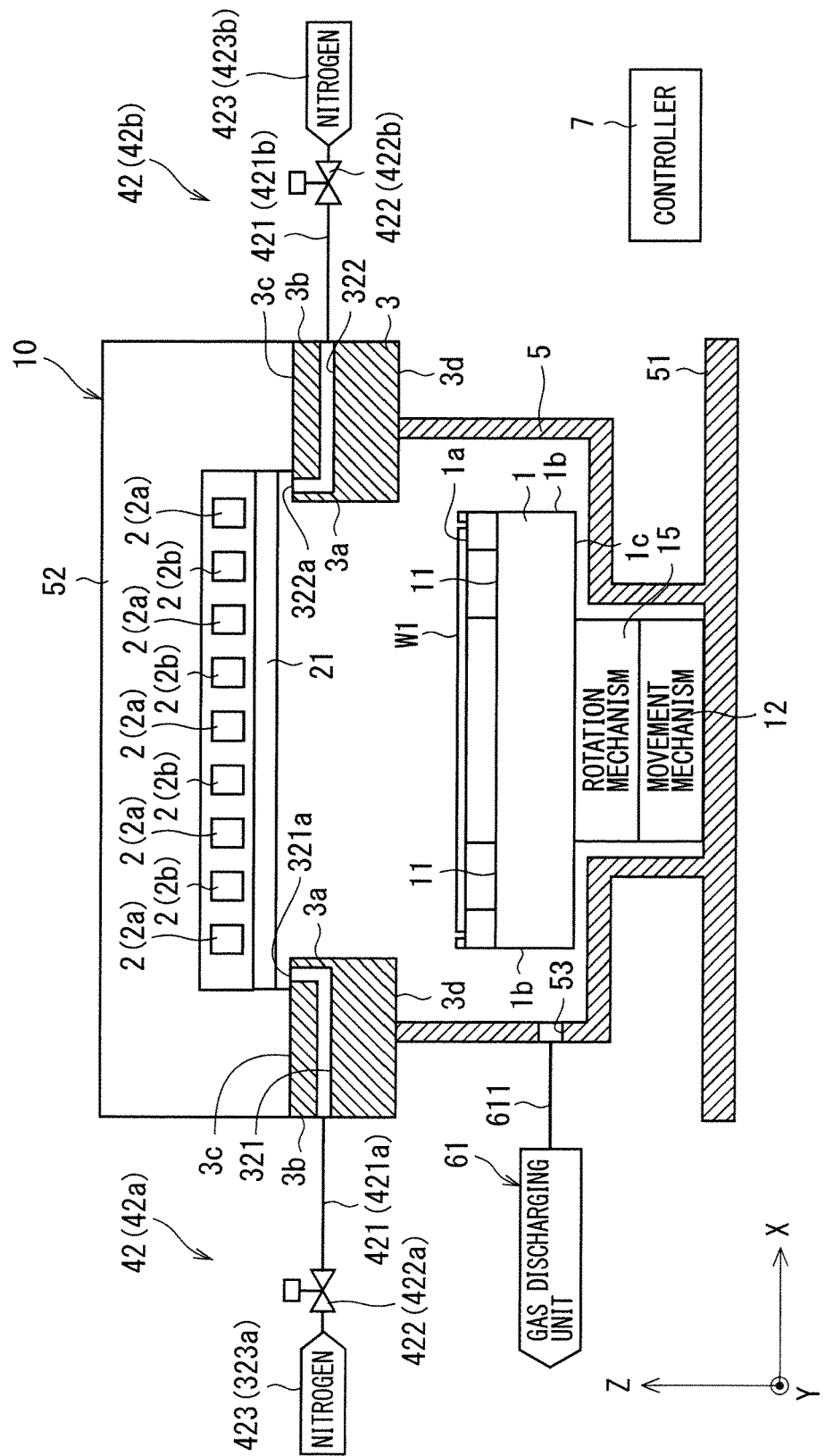
FIG. 1 is a diagram schematically illustrating an exemplary configuration of a substrate processing device.

Preferred embodiments will be described in detail below with reference to the accompanying drawings. For description of the positional relation between components, the drawings include an XYZ orthogonal coordinate system having a Z direction along the vertical direction and an XY plane along the horizontal plane as appropriate. To facilitate understanding, the size of each component and the number thereof are exaggerated or simplified in the drawings as necessary. The expressions of "positive Z side" and "negative Z side" are introduced in the following description as appropriate. The "positive Z side" means the upper side in the Z direction, and the "negative Z side" means the lower side in the Z direction.

First Preferred Embodiment

<Substrate Processing Device>

Figure 2:
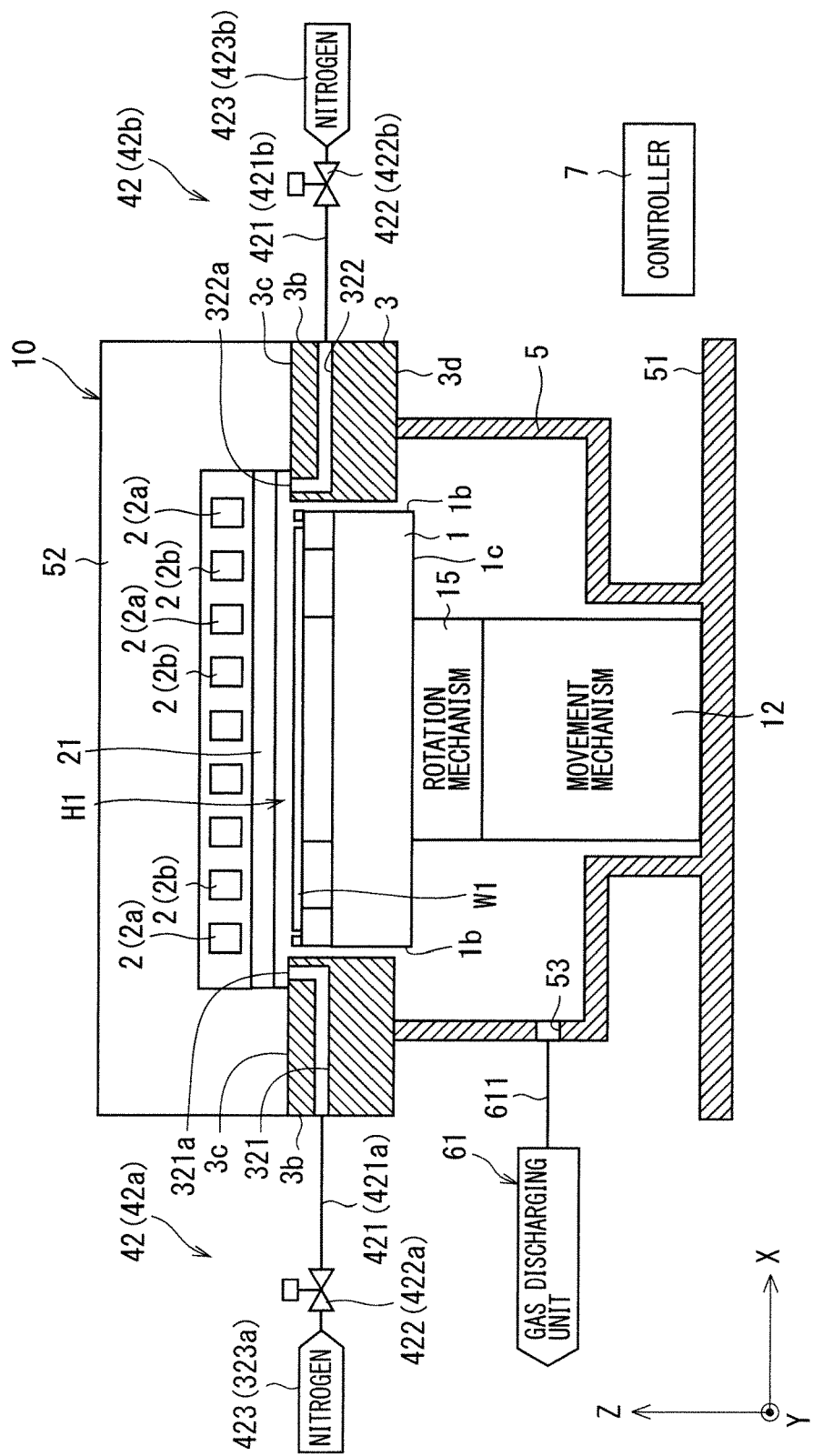
FIG. 2 is a diagram schematically illustrating an exemplary configuration of the substrate processing device.

FIGS. 1 and 2 are each a diagram schematically illustrating an exemplary configuration of a substrate processing device 10. A substrate W1 is conveyed into the substrate processing device 10.

The substrate W1 is a semiconductor substrate provided with a plurality of fine structures (not illustrated) formed on a surface (main surface) thereof. A fine structure is a pattern such as a metal pattern, a semiconductor pattern, or a resist pattern. Thus, the main surface of the substrate W1 has an uneven shape due to the fine structures.

The fine structures are formed through a process performed before the substrate W1 is conveyed into the substrate processing device 10. For example, for example, a metal pattern is formed on the main surface of the substrate W1 by performing etching processing with supply of drug solution on the substrate W1 on which a resist pattern is formed. After the etching processing, rinse processing, water-repellent processing, and dry processing are performed. In the rinse processing, pure water is supplied to the substrate W1 to wash away the drug solution. In the dry processing, for example, the substrate W1 is rotated in the horizontal plane and dried. During the drying, the fine structures potentially collapse due to the surface tension of the pure water. This collapse is more likely to occur for a higher aspect ratio (ratio of the height relative to the width) of the fine structures. For example, the fine structures are likely to collapse when the aspect ratio is 3.5 or higher. In this example, the aspect ratio of the fine structures formed on the substrate W1 is 3.5 or higher. The fine structures are more likely to collapse for a narrower interval (width of a gap) between the fine structures. In this example, the interval of the fine structures is 40 nm or shorter. Alternatively, the fine structures have a pitch (distance between centers) of 50 nm or shorter.

To avoid this collapse, the water-repellent processing is performed before the dry processing. In the water-repellent processing, processing liquid containing water-repellent agent is supplied to the main surface of the substrate W1 to form a water-repellent film (organic substance) on the surface of each fine structure. This processing reduces the surface tension of the pure water that acts on the fine structures, thereby avoiding collapse of the fine structures in the dry processing. However, such a water-repellent film is unnecessary as a semiconductor product. Thus, the water-repellent film is desired to be removed after the dry processing.

The substrate processing device 10 performs organic substance removal processing on the substrate W1. The substrate processing device 10 includes a substrate holder 1, a movement mechanism 12, a rotation mechanism 15, a plurality of ultraviolet irradiators 2, a tubular member 3, a gas supplying unit 42, and a gas discharging unit 61.

<Substrate Holder>

The substrate holder 1 horizontally holds the substrate W1. When the substrate W1 is a semiconductor substrate (in other words, a semiconductor wafer), the substrate W1 has a substantially circular flat plate shape. The main surface of the substrate W1 being held, on which the fine structures are formed, faces to the positive Z side.

The substrate holder 1 has a cylindrical shape and includes an upper surface 1a, a side surface 1b, and a lower surface 1c. The side surface 1b couples the periphery of the upper surface 1a and the periphery of the lower surface 1c. The substrate W1 is placed on the upper surface 1a of the substrate holder 1. The substrate holder 1 is formed of, for example, ceramic. In the example illustrated in FIG. 1, grooves 11 are formed on the upper surface 1a of the substrate holder 1. Hands of a substrate conveyance robot (not illustrated) penetrate into the grooves 11 when the conveyance robot places the substrate W1 onto the substrate holder 1.

<Ultraviolet Irradiator>

The ultraviolet irradiators 2 are disposed on the positive Z side of the substrate holder 1 and irradiate the main surface of the substrate W1 held by the substrate holder 1 with ultraviolet rays. In the example illustrated in FIGS. 1 and 2, two ultraviolet irradiators 2a and 2b are provided as the ultraviolet irradiators 2. The ultraviolet irradiators 2a and 2b emit ultraviolet rays in spectra (spectral distributions) different from each other. The following describes the definition of "different spectra". The different spectra mean that peak wavelengths included in the spectra of light output from light sources are different from each other. A peak wavelength is the wavelength of light the intensity of which takes a peak value in the corresponding spectrum. A plurality of peak wavelengths can exist in the spectrum of one light source. For example, an ultraviolet ray emitted from a low-pressure mercury lamp has a plurality of peak wavelengths at, for example, 185 nm and 254 nm.

Examples of the ultraviolet irradiators 2 include light sources such as a low-pressure mercury lamp, a high pressure mercury lamp, an excimer lamp, a metal halide lamp, and an ultraviolet (UV) light emitting diode (LED). The spectra of light emitted from these various light sources are different from each other.

The spectra of light sources of the same kind can be different from each other. For example, an excimer lamp includes a quartz tube filled with electrical discharging gas (such as noble gas or noble-gas-halogen compound) and a pair of electrodes. The electrical discharging gas exists between the pair of electrodes. The electrical discharging gas is excited into an excimer state by applying high voltage at high frequency between the pair of electrodes. The electrical discharging gas emits an ultraviolet ray when returning from the excimer state to the ground state. The spectrum of the ultraviolet ray emitted from the excimer lamp can differ depending on, for example, the kind of the electrical discharging gas. Specifically, the ultraviolet ray emitted from the excimer lamp can have a peak wavelength at 126 nm, 146 nm, 172 nm, 222 nm, or 308 nm, depending on, for example, the kind of the electrical discharging gas.

Thus, the ultraviolet irradiators 2 may be a plurality of kinds of light sources such as a low-pressure mercury lamp and an excimer lamp, or may be light sources of an identical kind that have different spectra.

To avoid redundant expression in the following description, the spectrum and peak wavelength of an ultraviolet ray emitted from an ultraviolet irradiator are also referred to as the spectrum and peak wavelength, respectively, of the ultraviolet irradiator. In addition, for simplification in the following description, the ultraviolet irradiators 2a and 2b each have a single peak wavelength (referred to as a wavelength $\lambda a$ or $\lambda b$, respectively) at 126 nm or 172 nm, respectively.

Each ultraviolet irradiator 2 has an optional shape, but may be, for example, a point light source. In the example illustrated in FIGS. 1 and 2, a plurality of ultraviolet irradiators 2a and a plurality of ultraviolet irradiators 2b are provided. The ultraviolet irradiators 2a are disposed in a distributed manner equally for the substrate W1. With this configuration, the ultraviolet irradiators 2a can more uniformly irradiate the entire main surface of the substrate W1 with ultraviolet rays. The same configuration applies to the ultraviolet irradiators 2b.

Alternatively, the ultraviolet irradiators 2 may be line light sources. The ultraviolet irradiators 2 each have a long bar shape in a longitudinal direction. The ultraviolet irradiators 2 are disposed side by side in the X direction with the longitudinal directions thereof aligned with the Y direction. Alternatively, the ultraviolet irradiators 2 may each have a ring shape. The ultraviolet irradiators 2 are concentrically disposed. These ultraviolet irradiators 2 irradiate the entire main surface of the substrate W1 with ultraviolet rays.

A quartz glass 21 as a plate member having ultraviolet translucency, thermal resistance, and anticorrosion is provided on the negative Z side of the ultraviolet irradiators 2 (specifically, between the ultraviolet irradiators 2 and the substrate W1). The quartz glass 21 is horizontally provided and faces to all ultraviolet irradiators 2 in the Z direction. The quartz glass 21 can protect the ultraviolet irradiators 2 from an atmosphere in the substrate processing device 10. Ultraviolet rays from the ultraviolet irradiators 2 transmit through the quartz glass 21 and are incident on the main surface of the substrate W1.

<Movement Mechanism>

The movement mechanism 12 can move the substrate holder 1 in the Z direction. For example, the movement mechanism 12 is attached to the lower surface 1c of the substrate holder 1 through the rotation mechanism 15. The movement mechanism 12 can reciprocate the substrate holder 1 between a first position (refer to FIG. 2) at which the substrate holder 1 is close to the ultraviolet irradiators 2 and a second position (refer to FIG. 1) at which the substrate holder 1 is away from the ultraviolet irradiators 2. As described later, the first position is the position of the substrate holder 1 when processing using ultraviolet rays is performed on the substrate W1, and the second position is the position of the substrate holder 1 when the substrate W1 is passed. The distance between the substrate holder 1 and the ultraviolet irradiators 2 at the first position is shorter than the distance between the substrate holder 1 and the ultraviolet irradiators 2 at the second position. The movement mechanism 12 may be, for example, an air cylinder, a ball screw mechanism, or a uniaxial stage. The movement mechanism 12 may be surrounded and covered by a bellows.

<Rotation Mechanism>

The rotation mechanism 15 rotates the substrate holder 1 in the horizontal plane. More specifically, the rotation mechanism 15 rotates the substrate holder 1 about a rotational axis orthogonal to the main surface of the substrate W1 through the center of the substrate W1. The rotation mechanism 15 is, for example, a motor. As the substrate holder 1 is rotated, the substrate W1 is rotated in the horizontal plane.

The rotation mechanism 15 rotates the substrate holder 1 during ultraviolet irradiation by the ultraviolet irradiators 2. Accordingly, the substrate W1 is irradiated with ultraviolet rays while being rotated. In this manner, the main surface of the substrate W1 can be more uniformly irradiated with ultraviolet rays.

<Tubular Member and Gas Supplying Unit>

The tubular member 3 has a tubular shape including an inner peripheral surface (inner surface) 3a, an outer peripheral surface 3b, an upper surface 3c, and a lower surface 3d. The upper surface 3c couples the inner peripheral surface 3a and the outer peripheral surface 3b, and is positioned on the positive Z side. The lower surface 3d couples the inner peripheral surface 3a and the outer peripheral surface 3b, and is positioned on the negative Z side. The tubular member 3 has a cylindrical shape. The inner peripheral surface 3a of the tubular member 3 has a diameter larger than that of the side surface 1b of the substrate holder 1. As illustrated in FIG. 2, the inner peripheral surface 3a of the tubular member 3 surrounds the side surface 1b of the substrate holder 1 while the substrate holder 1 is stopping at the first position.

While the substrate holder 1 is stopping at the first position (FIG. 2), the ultraviolet irradiators 2 emits ultraviolet rays. Accordingly, processing using ultraviolet rays is performed on the substrate W1. While the substrate holder 1 is stopping at the first position, the substrate W1 is surrounded by the quartz glass 21, the tubular member 3, and the substrate holder 1. In this state, the substrate W1 cannot be easily taken out of the substrate holder 1.

Then, the movement mechanism 12 moves the substrate holder 1 to the second position (FIG. 1). Accordingly, the substrate holder 1 is retracted from the inside of the inner peripheral surface 3a of the tubular member 3 in a direction departing from the ultraviolet irradiators 2. At the second position, the substrate W1 is positioned on the negative Z side of the lower surface 3d of the tubular member 3. Thus, the substrate W1 is not encumbered by the tubular member 3 when being conveyed out of the substrate processing device 10 by substrate conveying means (not illustrated). The substrate holder 1 is stopping at the second position when the substrate W1 is placed onto the substrate holder 1 by the substrate conveying means.

The tubular member 3 includes through-holes 321 and 322. The through-holes 321 and 322 penetrate through the tubular member 3 and are communicated with a space between the quartz glass 21 and the substrate W1. Hereinafter, this space is also referred to as an active space H1. The ultraviolet irradiators 2 face to the substrate holder 1 through the active space H1. The through-holes 321 and 322 each have one end opened at the upper surface 3c of the tubular member 3. Hereinafter, these ends of the through-holes 321 and 322 are referred to as openings (gas supply openings) 321a and 322a. The upper surface 3c of the tubular member 3 faces to a peripheral part of the quartz glass 21 through a void space where the openings 321a and 322a are provided. The openings 321a and 322a are continuous with the active space H1. In other words, the through-holes 321 and 322 are communicated with the active space H1. The openings 321a and 322a are provided at positions facing to each other with respect to the central axis of the inner peripheral surface 3a.

The through-holes 321 and 322 each have the other end opened at the outer peripheral surface 3b of the tubular member 3. The other ends of the through-holes 321 and 322 are coupled with the gas supplying unit 42. Specifically, the other end of the through-hole 321 is connected with a gas supplying unit 42a, and the other end of the through-hole 322 is connected with a gas supplying unit 42b. The gas supplying units 42a and 42b supply gas such as inert gas (for example, nitrogen or argon) to the active space H1 through the through-holes 321 and 322, respectively. Thus, the through-holes 321 and 322 function as gas supplying paths.

The gas supplying units 42a and 42b each include a pipe 421, an on-off valve 422, and a gas supplying source 423.

Hereinafter, the pipe 421, the on-off valve 422, and the gas supplying source 423 that belong to the gas supplying unit 42a are referred to as a pipe 421a, an on-off valve 422a, and a gas supplying source 423a, respectively, the pipe 421, the on-off valve 422, and the gas supplying source 423 that belong to the gas supplying unit 42b are referred to as a pipe 421b, an on-off valve 422b, and a gas supplying source 423b, respectively. The gas supplying units 42a and 42b are identical to each other except for where the pipe 421 is connected. The gas supplying sources 423a and 423b house gas to be supplied to the active space H1. The gas supplying source 423a is coupled with one end of the pipe 421a, and the gas supplying source 423b is coupled with one end of the pipe 421b. The on-off valve 422a is provided to the pipe 421a to switch opening and closing of the pipe 421a, and the on-off valve 422b is provided to the pipe 421b to switch opening and closing of the pipe 421b. The pipe 421a has the other end coupled with the other end of the through-hole 321, and the pipe 421b has the other end coupled with the other end of the through-hole 322.

<Sealed Space>

The substrate processing device 10 may form a sealed space. In the example illustrated in FIGS. 1 and 2, a ceiling member 52, the tubular member 3, a partition 5, and a floor 51 are coupled with each other to form a sealed space. A lower surface of the ceiling member 52 has a protrusion shape protruding toward the tubular member 3 at a peripheral part. In other words, a central part of the ceiling member 52 has a concave shape with respect to the negative Z side. The ultraviolet irradiators 2 and the quartz glass 21 are disposed in this concave shape. A side surface of the quartz glass 21 is in contact with an inner surface of the protrusion shape of the ceiling member 52. An outer peripheral part of the upper surface 3c of the tubular member 3 is coupled with the protrusion shape of the ceiling member 52 in the Z direction. The openings 321a and 322a of the through-holes 321 and 322 are provided at an inner peripheral part of the upper surface 3c, facing to a lower surface of the quartz glass 21 through the void space in the Z direction. The partition 5 is coupled with the lower surface 3d of the tubular member 3. The partition 5 extends in the Z direction and is coupled with the floor 51. The sealed space formed by the ceiling member 52, the tubular member 3, the partition 5, and the floor 51 houses the ultraviolet irradiators 2, the quartz glass 21, the substrate holder 1, and the movement mechanism 12.

<Gas Discharging>

The partition 5 includes a gas discharging through-hole 53. The through-hole 53 is coupled with the gas discharging unit 61. The gas discharging unit 61 includes, for example, a pipe 611 coupled with the through-hole 53. Gas in the substrate processing device 10 is externally discharged through the pipe 611.

<Shutter>

The partition 5 is provided with a shutter (not illustrated) that functions as a gateway for the substrate W1. When the shutter is opened, the inside of the substrate processing device 10 is communicated with the outside thereof. The substrate conveying means can convey the substrate W1 into or out of the substrate processing device 10 through the opened shutter.

<Controller>

A controller 7 controls the ultraviolet irradiators 2, the movement mechanism 12, the rotation mechanism 15, the on-off valve 422 of the gas supplying unit 42, the shutter, and the substrate conveying means.

The controller 7 is an electronic circuit instrument and may include, for example, a data processing device and a storage medium. The data processing device may be, for example, an arithmetic processing device such as a central processor unit (CPU). The storage unit may include a non-transitory storage medium (such as a read only memory (ROM) or a hard disk) and a transitory storage medium (such as a random access memory (RAM)). The non-transitory storage medium may store, for example, a computer program that defines processing executed by the controller 7. The processing defined by the computer program can be executed by the controller 7 when the computer program is executed by the processing device. Part or all of the processing executed by the controller 7 may be executed by hardware.

<Operation of Substrate Processing Device>

Figure 3:
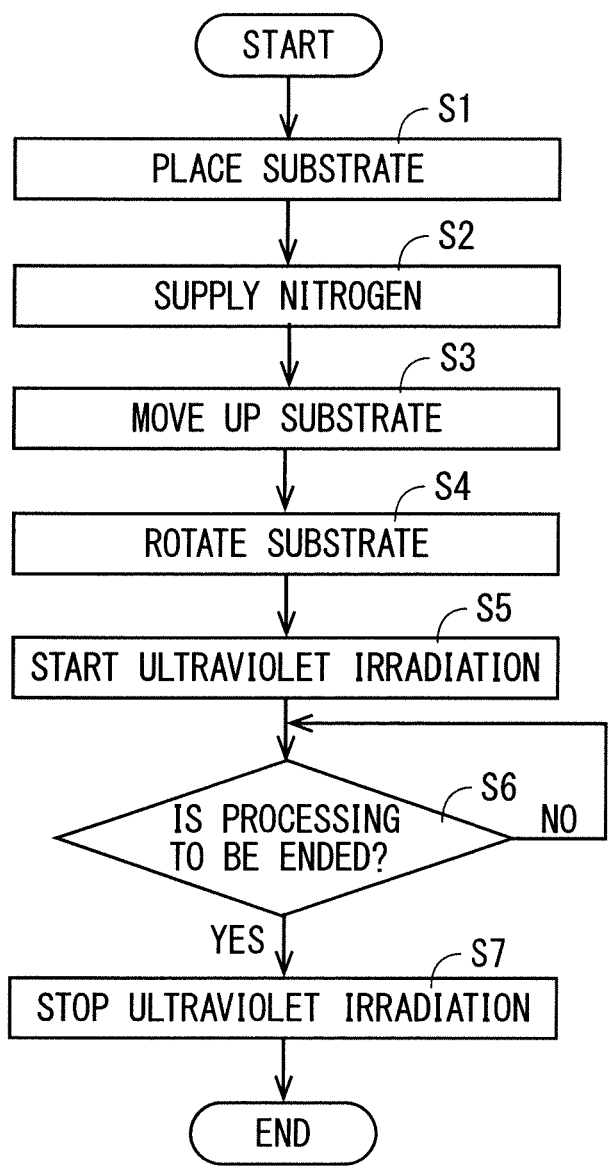
FIG. 3 is a flowchart illustrating an exemplary operation of the substrate processing device.

FIG. 3 is a flowchart illustrating an exemplary operation of the substrate processing device 10. The movement mechanism 12 is initially stopping the substrate holder 1 at the second position (FIG. 1). In this example, gas discharging by the gas discharging unit 61 is constantly performed. At step S1, after having opened the shutter, the controller 7 controls the substrate conveying means to place the substrate W1 onto the substrate holder 1, and thereafter closes the shutter. The fine structures are formed on the main surface of the substrate W1 on the positive Z side. The organic substance (for example, the water-repellent film) exists on the surface of each fine structure.

Subsequently at step S2, the controller 7 controls, for example, the gas supplying unit 42 to start gas supply. Accordingly, gas is discharged through the openings 321a and 322a. The gas may be, for example, nitrogen. Steps S1 and S2 may be executed in the opposite order or may be executed in parallel.

Subsequently at step S3, the controller 7 controls the movement mechanism 12 to move the substrate holder 1 closer to the ultraviolet irradiators 2 and stop the substrate holder 1 at the first position. In this state, the distance between the ultraviolet irradiators 2 and the substrate W1 is set to be 2 to 3 mm approximately. Step S3 does not necessarily need to be executed subsequently after step S2, but may be executed after step S1.

Subsequently at step S4, the controller 7 controls the rotation mechanism 15 to rotate the substrate holder 1. Accordingly, the substrate W1 is rotated in the horizontal plane. Step S4 does not necessarily need to be executed subsequently after step S3, but may be executed after step S1.

Subsequently at step S5, the controller 7 causes all ultraviolet irradiators 2 (in this example, the ultraviolet irradiators 2a and 2b) to emit ultraviolet rays. The controller 7 may execute step S5 when a predetermined atmosphere is achieved in the active space H1 (for example, when the concentration of oxygen becomes lower than a reference value). For example, the controller 7 may determine that a desired atmosphere is achieved when the elapsed time since step S4 is longer than a predetermined reference value. The elapsed time can be measured by a measurement circuit such as a timer circuit. Alternatively, the atmosphere in the active space H1 (for example, the oxygen concentration) may be measured so that the controller 7 determines whether the predetermined atmosphere is achieved in the active space H1 based on this measured value.

The organic substance removal processing using ultraviolet rays is performed on the substrate W1 through the ultraviolet irradiation by the ultraviolet irradiators 2. Specifically, ultraviolet rays act on the organic substance (for example, the water-repellent film) on the main surface of the substrate W1, thereby disassembling and removing the organic substance. This is because ultraviolet rays have large photon energy enough to disconnect molecular binding of the organic substance. Since photon energy is larger for a shorter wavelength, an ultraviolet ray having a shorter wavelength can disconnect a larger number of kinds of molecular binding, thereby removing the organic substance at a higher removal speed. In this viewpoint, it is desirable to use an ultraviolet ray having a shorter wavelength.

However, when each gap between the fine structures is narrow, an ultraviolet ray having a shorter wavelength is more unlikely to penetrate into the gap as described with a simulation result later. This is because an ultraviolet ray having a shorter wavelength is more unlikely to diffract. In the gap between the fine structures, the intensity of an ultraviolet ray varies in a depth direction of the gap through diffraction, reflection, and interference.

Figure 4:
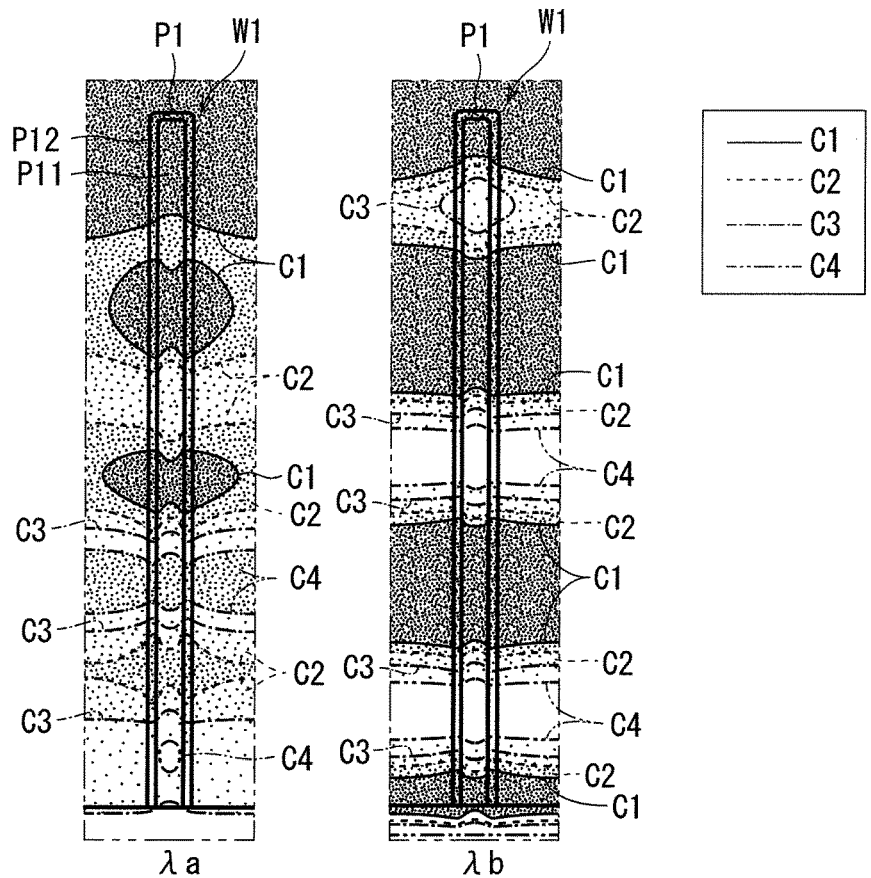
FIG. 4 is a contour diagram illustrating a schematic example of ultraviolet intensity.
Figure 5:
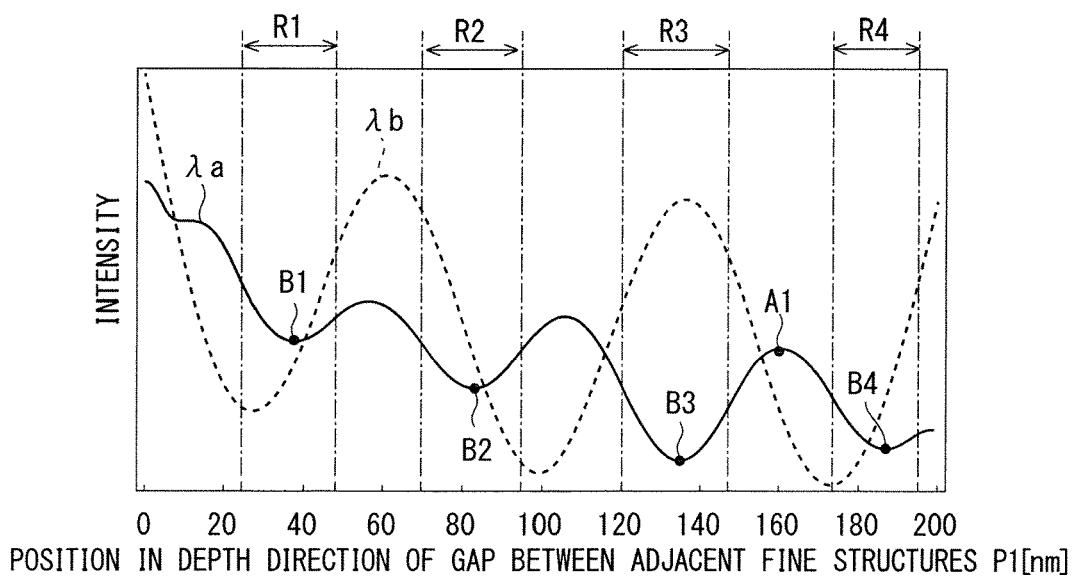
FIG. 5 is a graph illustrating a schematic example of ultraviolet intensity.

FIGS. 4 and 5 are diagrams illustrating exemplary intensity of an ultraviolet ray near a fine structure P1 on the substrate W1 at wavelengths. FIGS. 4 and 5 illustrate a simulation result. In FIG. 4, a result when ultraviolet ray having the wavelength $\lambda a$ (=126 nm) is used is illustrated on the left side, and a result when ultraviolet ray having the wavelength $\lambda b$ (=172 nm) is used is illustrated on the right side. In the example illustrated in FIG. 4, the intensity of an ultraviolet ray is illustrated with contours C1 to C4. The intensity of an ultraviolet ray illustrated with the contours C1 to C4 is higher for a contour having a smaller reference sign. The intensity illustrated with the contour C1 is highest, the intensity illustrated with the contour C4 is lowest, and the intensity illustrated with the contour C2 is higher than the intensity illustrated with the contour C3.

FIG. 4 illustrates a section of the fine structure P1, which has a substantially rectangular shape. It can be assumed that the fine structure P1 is made of silicon P11 as a body part having a rectangular shape and a SiO2 film P12 formed on the surface of the silicon. The SiO2 film P12 has a film thickness of 1 nm approximately or smaller. The fine structure P1 is set to have a height of 200 nm and a width of 10 nm. Although FIG. 4 illustrates the intensity of an ultraviolet ray near the single fine structure P1, actual simulation was performed for a structure in which a plurality of fine structures P1 are disposed side by side at a constant interval (pitch) in the horizontal direction. In this simulation, the pitch of the fine structures P1 was set to be 50 nm. Accordingly, each gap between the fine structures P1 has a width of 40 nm.

FIG. 5 illustrates the intensity of an ultraviolet ray on a side surface of the fine structure P1 in the depth direction of the gap (the Z direction). Hereinafter, a position in the depth direction of the gap is referred to as a depth position. The depth position of an upper end (edge on the positive Z side) of the fine structure P1 is defined to be 0 nm. Since the height of the fine structure P1 is 200 nm, the depth position of a lower end (edge on the negative Z side) of the fine structure P1 is 200 nm. In FIG. 5, the intensity of an ultraviolet ray emitted by the ultraviolet irradiators 2a and having the wavelength $\lambda a$ is illustrated with a solid line, and the intensity of an ultraviolet ray emitted from the ultraviolet irradiators 2b and having the wavelength $\lambda b$ is illustrated with a dashed line.

As illustrated in FIGS. 4 and 5, the intensity of an ultraviolet ray having the wavelength $\lambda a$ tends to repeatedly vary with the depth position from the upper end of the fine structure P1 to the lower end thereof, having gradually decreasing peak values (local maximum values). However, the intensity of an ultraviolet ray having the wavelength $\lambda b$ repeatedly varies with the depth position from the upper end of the fine structure P1 to the lower end thereof, but has peak values not much decreasing.

The variation of an ultraviolet ray in the depth direction of the gap between the fine structures P1 has periods different between the wavelengths λa and λb. Thus, the depth position of the intensity of an ultraviolet ray at each peak value is different between the wavelengths λa and λb, and the depth position of the intensity of an ultraviolet ray at each bottom value (local minimum value) is different between the wavelengths λa and a. For example, near the depth position of 140 nm, the intensity of the ultraviolet ray having the wavelength λa takes a bottom value, but the intensity of the ultraviolet ray having the wavelength λb takes a peak value. This indicates that, in a region near the depth position of 140 nm, insufficiency of the intensity of the ultraviolet ray having the wavelength λa can be compensated by the intensity of the ultraviolet ray having the wavelength λb.

Thus, when the ultraviolet irradiators 2a and 2b both irradiate the main surface of the substrate W1 with ultraviolet rays, the organic substance can be disassembled by the ultraviolet ray having the wavelength λb in a region in which the intensity of the ultraviolet ray having the wavelength λa is low and the organic substance is unlikely to be disassembled.

Subsequently at step S6 in FIG. 3, the controller 7 determines whether to end the processing on the substrate W1. For example, the controller 7 may determine that the processing is to be ended when the elapsed time since step S5 exceeds a predetermined time. When having determined that the processing is to be ended, the controller 7 causes the ultraviolet irradiators 2 to stop emitting ultraviolet rays at step S7. This ends the organic substance removal processing using ultraviolet rays.

As described above, in the substrate processing device 10, the ultraviolet irradiators 2a and 2b irradiate the main surface of the substrate W1 with ultraviolet rays in spectra different from each other. In this manner, the organic substance can be disassembled and removed by the ultraviolet ray having the wavelength λb in a region in which the intensity of the ultraviolet ray having the wavelength λa is low in the gap between the fine structures P1. Accordingly, the organic substance existing in a wider range in the gap between the fine structures P1 can be removed.

<Wavelength Selection>

Figure 6:
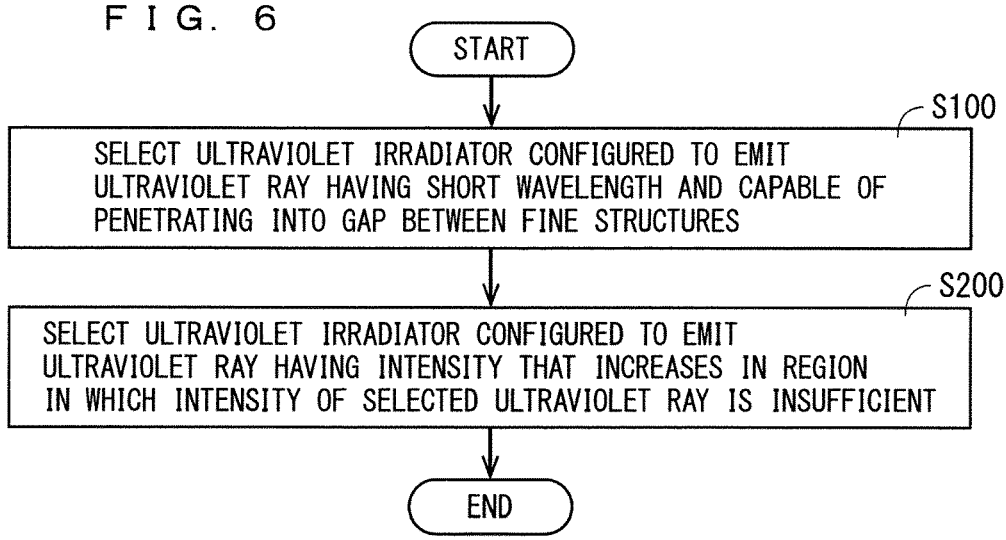
FIG. 6 is a flowchart schematically illustrating an exemplary ultraviolet irradiator selecting method.
Figure 7:
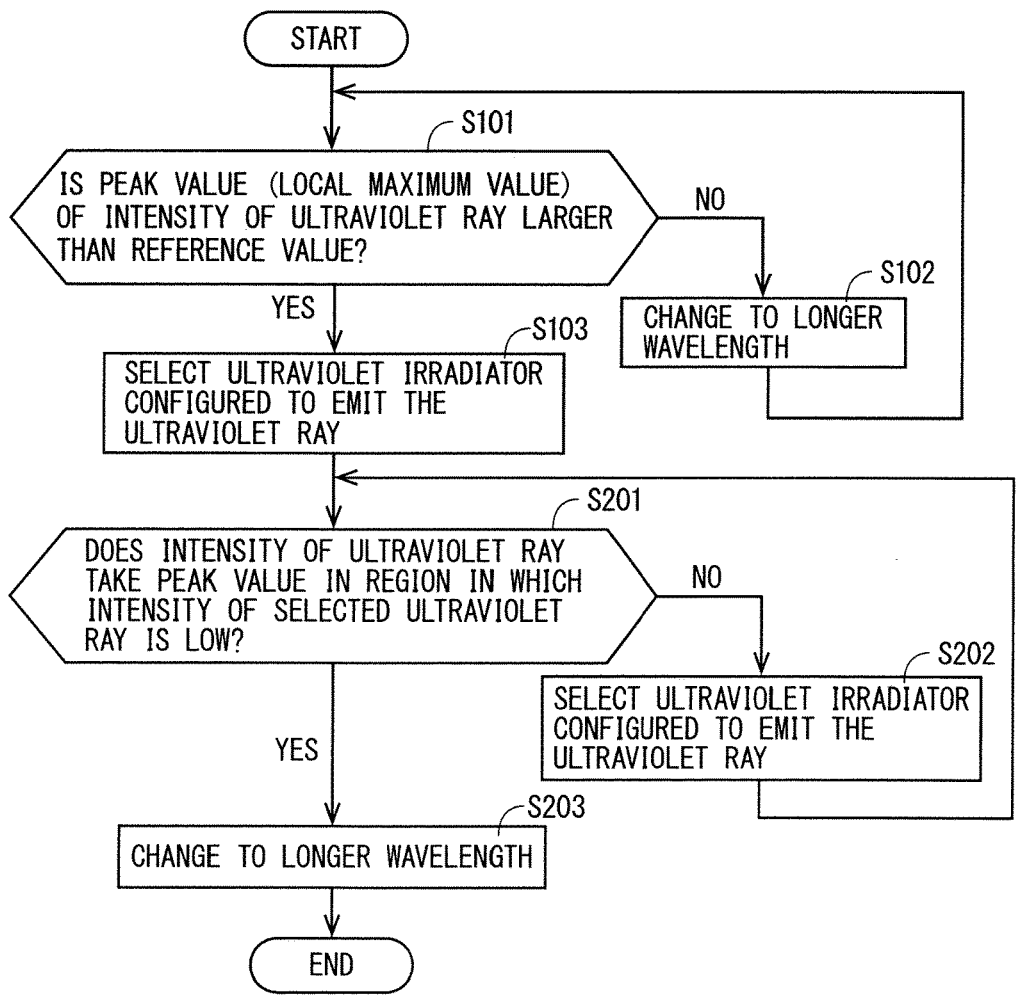
FIG. 7 is a flowchart specifically illustrating the exemplary ultraviolet irradiator selecting method.

The following describes exemplary peak wavelength selection rules. FIG. 6 is a flowchart conceptually illustrating an exemplary selection method, and FIG. 7 is a flowchart illustrating more specifically the exemplary selection method. First at step S100, any ultraviolet irradiator 2 configured to emit an ultraviolet ray capable of penetrating into the gap between the fine structures P1 and having a short wavelength is selected. For example, any ultraviolet irradiator 2 configured to emit an ultraviolet light having a short wavelength and a sufficiently high intensity in the gap between the fine structures P1 is selected. Specifically, step S100 is executed through, for example, steps S101 to S103 in FIG. 7.

At step S101, it is determined whether the intensity of an ultraviolet ray having a particular wavelength has a peak value higher than a predetermined reference value. As described later, step S101 may be repeatedly executed for different wavelengths. The wavelength at the first execution at step S101 is shortest among candidate wavelengths.

The intensity of an ultraviolet ray has a plurality of peak values as illustrated in FIG. 5 in some cases. In such a case, it is determined whether a minimum peak value among a plurality of peak values is higher than the reference value. For example, in FIG. 5, the intensity of the ultraviolet ray having the wavelength λa has a plurality of peak values. These peak values tend to be lower for larger depth positions. The minimum peak value is peak value A1 when the depth position is largest. Peak value A1 can be obtained by, for example, simulation or experiment.

When it is determined that the minimum peak value is lower than the reference value at step S101, the wavelength is changed to a longer wavelength at step S102, and then step S101 is executed again by using an ultraviolet ray having the changed wavelength. Specifically, when the minimum peak value for a particular wavelength is lower than the reference value, it is determined that an ultraviolet ray having the wavelength does not sufficiently penetrate into the gap between the fine structures P1, and then the same determination is performed for an ultraviolet ray having a wavelength longer than the wavelength.

When it is determined that the minimum peak value is higher than the reference value at step S101, any ultraviolet irradiator 2 configured to emit an ultraviolet ray having the wavelength is selected at step S103. In other words, it is determined to provide the substrate processing device 10 with the ultraviolet irradiator 2 configured to emit an ultraviolet ray having the wavelength. In this manner, an ultraviolet ray capable of penetrating into the gap between the fine structures P1 appropriately and having a shorter wavelength can be selected. In this example, it is assumed that the ultraviolet ray having the wavelength λa is selected.

At step S200 following step S100 in FIG. 6, any ultraviolet irradiator 2 configured to emit an ultraviolet ray having a wavelength longer than the wavelength λa selected at step S100 and having higher intensity in a region in which the intensity of the ultraviolet ray having the wavelength λa is insufficient is selected. Step S200 is executed through, for example, steps S201 to S203 in FIG. 7. At step S201, it is determined whether the intensity of an ultraviolet ray having a wavelength longer than the wavelength λa takes a peak value in at least one of regions R1 to R4 in which the intensity of the ultraviolet ray having the wavelength λa is small. Upon negative determination at step S201, the wavelength is changed to a longer wavelength at step S202, and step S201 is executed again by using the changed wavelength. Specifically, it is determined that insufficiency of the intensity of the ultraviolet ray having the wavelength λa in the regions R1 to R4 cannot be sufficiently compensated by an ultraviolet ray for which the negative determination is obtained at step S201, and the same determination is performed for an ultraviolet ray having a longer wavelength. Upon the positive determination at step S201, any ultraviolet irradiators 2 configured to emit an ultraviolet ray having the wavelength is selected at step S203. In other words, it is determined to install the ultraviolet irradiator 2 configured to emit an ultraviolet ray having the wavelength onto the substrate processing device 10. In this example, it is assumed that the wavelength λb is selected. Accordingly, intensity insufficiency in a region in which the intensity of the ultraviolet ray having the wavelength λa is insufficient can be compensated by the ultraviolet ray having the wavelength λb.

The following describes exemplary definition of the regions R1 to R4 in more detail. In this example, a region Rn (n is an integer of 1 to 4) is defined with the center of the region Rn in the depth direction and the width of the region Rn in the depth direction. Specifically, the center of the region Rn is at a depth position where the intensity of the ultraviolet ray having the wavelength λa takes a bottom value Bn (n is an integer of 1 to 4), and the width of the region Rn is equal to half of a period (variation period) Wt1 of the intensity of the ultraviolet ray having the wavelength λa in the depth direction.

In the region Rn thus defined, the intensity of the ultraviolet ray having the wavelength λa is low. Thus, when the intensity of the ultraviolet ray having the wavelength λb takes a peak value anywhere in the region Rn, insufficiency of the intensity of the ultraviolet ray having the wavelength λa in the region can be effectively compensated by the ultraviolet ray having the wavelength λb.

As illustrated in FIG. 5, the bottom value Bn tends to decrease as the depth position is deeper. Accordingly, insufficiency of the intensity of the ultraviolet ray having the wavelength λa is more significant in the regions R2 to R4, which are positioned deeper than the region R1 at a shallowest position. Thus, at step S21, it may be determined whether the intensity of an ultraviolet ray takes a peak value anywhere in, for example, the regions R2 to R4, which are positioned shallower the region R1. In the example illustrated in FIG. 5, the intensity of the ultraviolet ray having the wavelength λb takes a peak value in the region R3. Thus, significant insufficiency of the intensity of the ultraviolet ray having the wavelength λa in the region R3 can be compensated by the ultraviolet ray having the wavelength λb.

Alternatively, for example, the wavelength λb may be selected so that the intensity of the ultraviolet ray having the wavelength λb takes a peak value anywhere in the regions R3 and R4, which are positioned closer to the lower end of the fine structure P1 than a central position (the depth position of 100 nm in FIG. 5) in a height direction of the fine structure P1.

<Irradiation Duration of Ultraviolet Irradiator 2>

According to the flowchart illustrated in FIG. 3, the ultraviolet irradiators 2*a* and 2*b* simultaneously emit ultraviolet rays. In other words, the durations of irradiation by the ultraviolet irradiators 2*a* and 2*b* completely overlap with each other. With this configuration, the organic substance removal processing can achieve improved throughput as compared to a case in which one of the ultraviolet irradiators 2*a* and 2*b* performs irradiation after the other has ended irradiation.

The irradiation durations of the ultraviolet irradiators 2*a* and 2*b* may be shifted from each other, and the irradiation durations only need to partially overlap with each other. With this configuration, too, the removal processing can achieve improved throughput as compared to a case in which one of the ultraviolet irradiators 2*a* and 2*b* performs irradiation after the other has ended irradiation.

<Supply of Inert Gas>

When oxygen exists in the active space H1, the oxygen potentially changes into ozone by absorbing ultraviolet rays. The ozone has strong oxidation power enough to disassemble the organic substance on the substrate W1. However, the capacity of removing the organic substance by the ozone is extremely smaller than the capacity of removing the organic substance by direct ultraviolet irradiation. For example, a processing time taken for organic substance removal by ozone is about more than 30 times as long as a processing time taken for organic substance removal by direct ultraviolet irradiation. Thus, the concentration of oxygen in the active space H1 is preferably low.

In the example illustrated in FIGS. 1 and 2, the gas supplying unit 42 supplies inert gas into the active space H1 so that the concentration of oxygen in the active space H1 is lowered. This can reduce decrease of the intensity of an ultraviolet ray on the main surface of the substrate W1 attributable to oxygen.

FIG. 8 is a graph schematically illustrating an exemplary relation between an ultraviolet irradiation time and the contact angle of pure water. The contact angle of pure water is the contact angle of pure water accumulated between the fine structures P1. The contact angle decreases as the organic substance on the fine structures P1 is removed. In the example illustrated in FIG. 8, the contact angle when inert gas (for example, nitrogen) is supplied by the gas supplying unit 42 is illustrated by a graph with black circles, and the contact angle when no inert gas is supplied is illustrated by a graph with white rectangles. As understood from the graphs illustrated in FIG. 8, the organic substance can be removed faster with the supply of inert gas by the gas supplying unit 42.

<Substrate Processing Device 10A>

Figure 9:
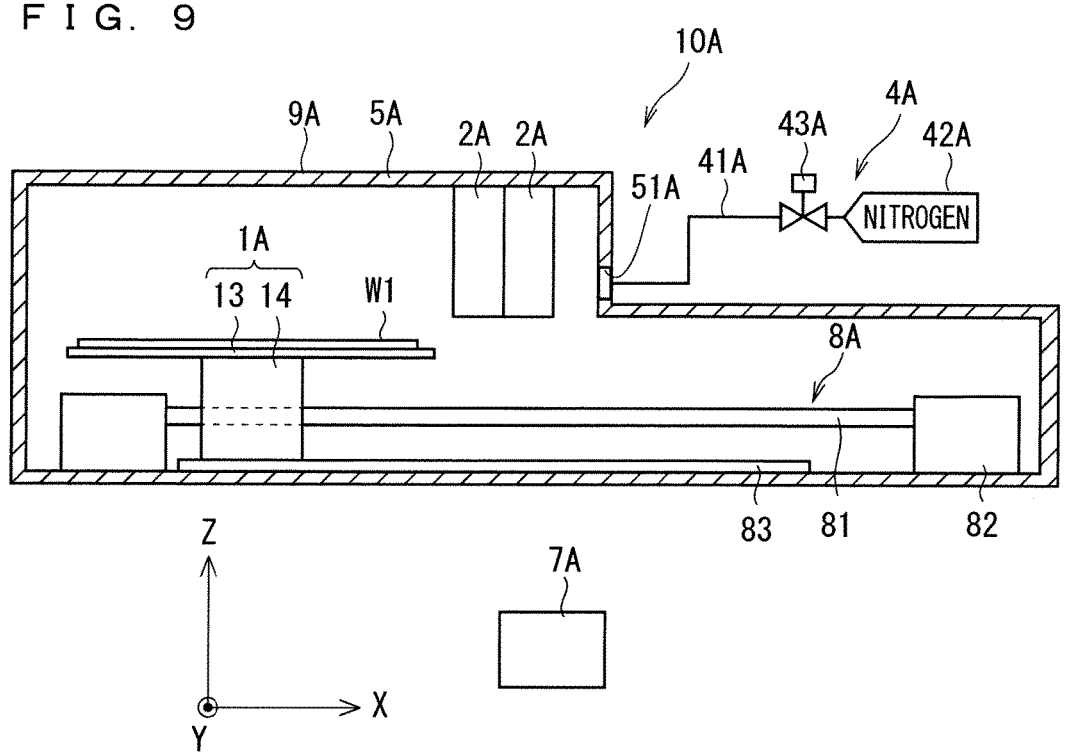
FIG. 9 is a diagram schematically illustrating an exemplary configuration of the substrate processing device.
Figure 10:
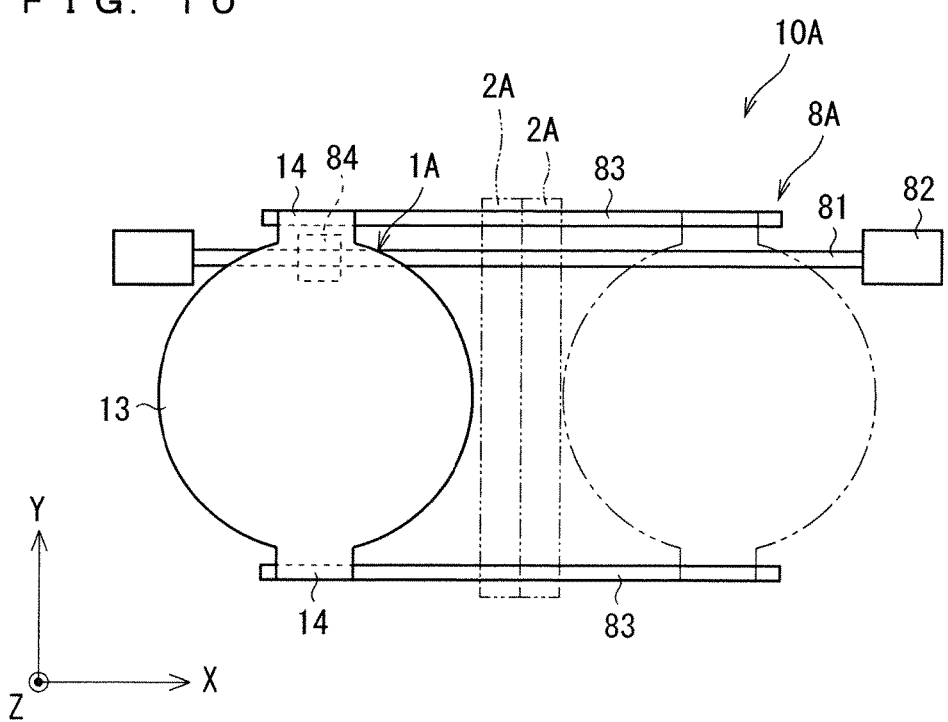
FIG. 10 is a diagram schematically illustrating an exemplary configuration of the substrate processing device.

FIGS. 9 and 10 are each a diagram schematically illustrating the configuration of a substrate processing device 10A as another example of the substrate processing device 10. FIG. 9 is a side view illustrating the substrate processing device 10A, and FIG. 10 is a plan view illustrating the substrate processing device 10A.

The substrate processing device 10A includes a substrate holder 1A, a plurality of ultraviolet irradiators 2A, a movement mechanism 8A, and a gas supplying unit 4A.

The substrate holder 1A includes a placement plate 13 and a pair of column members 14. The placement plate 13 is a horizontally provided plate member. The substrate W1 is placed on the placement plate 13. The main surface of the substrate W1 being placed, on which the fine structures are formed, faces to the positive Z side. The pair of column members 14 are column-shaped members extending in the Z direction and supporting both ends of the placement plate 13 in the Y direction, respectively. Thus, the substrate holder 1A has a bridge structure when viewed in the X direction.

The movement mechanism 8A reciprocates the substrate holder 1A in the X direction. The movement mechanism 8A includes a feed shaft 81, a feed shaft motor 82, a pair of guide rails 83, and a coupling member 84. The feed shaft 81 extends in the X direction. The feed shaft 81 is, for example, a ball screw connected with a rotational axis of the feed shaft motor 82.

The pair of guide rails 83 extend in the X direction. The feed shaft 81 and the pair of guide rails 83 are disposed in parallel to each other. The pair of column members 14 are provided movable in the X direction on the pair of guide rails 83, respectively. The pair of column members 14 have identical heights. The placement plate 13 is provided to connect upper end parts of the pair of column members 14. The placement plate 13 is a plate member having a substantially circular shape and supported by the pair of column members 14. The coupling member 84 is provided on a lower surface of the placement plate 13 to couple the placement plate 13 and the feed shaft 81.

The movement mechanism 8A (specifically, the feed shaft motor 82) is controlled by the controller 7. The feed shaft 81 is rotated when the feed shaft motor 82 operates. Accordingly, the coupling member 84 and the substrate holder 1A fixed thereto move in the X direction.

Similarly to the ultraviolet irradiators 2, the ultraviolet irradiators 2A emit ultraviolet rays in spectra different from each other. In the example illustrated in FIGS. 9 and 10, the two ultraviolet irradiators 2A are provided. The ultraviolet irradiators 2A are line light sources disposed side by side in the X direction with the longitudinal directions thereof aligned with the Y direction. The ultraviolet irradiators 2A each have a length in the Y direction longer than the diameter of the substrate W1, and a width in the X direction shorter than the radius of the substrate W1. The ultraviolet irradiators 2A are disposed on the positive Z side of the substrate W1 at a position halfway through the path of the substrate W1 being moved by the movement mechanism 8A. With this configuration, the substrate W1 moves across the ultraviolet irradiators 2A.

The substrate holder 1A, the movement mechanism 8A, and the ultraviolet irradiators 2A may be housed in a predetermined housing unit 5A. The housing unit 5A is provided with an opening (not illustrated) through which the substrate W1 is conveyed into and out. The opening may be configured to be opened and closed.

The gas supplying unit 4A supplies inert gas (for example, nitrogen or argon) into the housing unit 5A. The housing unit 5A is provided with a gas supply through-hole 51A connected with one end of a pipe 41A of the gas supplying unit 4A. The other end of the pipe is connected with a gas supplying source 42A in which gas is housed. The pipe 41A is provided with an on-off valve 43A.

The housing unit 5A may be provided with a gas discharge through-hole (not illustrated). Gas in the housing unit 5A is externally discharged through the gas discharge through-hole.

The ultraviolet irradiators 2A, the movement mechanism 8A, and the gas supplying unit 4A are controlled by a controller 7A. The controller 7A has a configuration same as that of the controller 7. The controller 7A controls the gas supplying unit 4A to supply, for example, nitrogen into the housing unit 5A. Accordingly, the concentration of oxygen in a space inside the housing unit 5A can be reduced. Then, the controller 7A controls the ultraviolet irradiators 2A and the movement mechanism 8A to cause the ultraviolet irradiators 2A to emit ultraviolet rays and simultaneously move the substrate W1 in the X direction. Accordingly, the substrate W1 is moved in the X direction directly below the ultraviolet irradiators 2A. In this manner, the entire main surface of the substrate W1 is irradiated by the ultraviolet irradiators 2A with ultraviolet rays in spectra different from each other. Thus, similarly to the substrate processing device 10, in the substrate processing device 10A, the organic substance in a wider range in the gap between the fine structures P1 can be removed.

The substrate processing device 10A may include a rotation mechanism. The rotation mechanism rotates the substrate holder 1A about an axis extending in the Z direction through the center of the substrate W1.

<Distance Between Ultraviolet Irradiator 2 and Substrate W1>

The distance between each ultraviolet irradiator 2 and the substrate holder 1 may be set to be shorter for a longer peak wavelength of an ultraviolet ray emitted from the ultraviolet irradiator 2. Specifically, since the wavelength λb is longer than the wavelength λa, the distance between each ultraviolet irradiator 2b and the substrate holder 1 is set to be shorter than the distance between each ultraviolet irradiator 2a and the substrate holder 1. Accordingly, the distance between each ultraviolet irradiator 2b and the substrate W1 is shorter than the distance between each ultraviolet irradiator 2a and the substrate W1.

In viewpoint of wavelength, the speed of the organic substance removal is slower with an ultraviolet ray having a longer wavelength as described above. However, the removal speed is faster for higher intensity of an ultraviolet ray acting on the organic substance. The intensity of an ultraviolet ray typically decreases with the distance from the ultraviolet irradiators 2.

In this example, the distance between each ultraviolet irradiator 2b, which leads to a slow removal speed in viewpoint of peak wavelength, and the substrate W1 is set to be shorter than the distance between each ultraviolet irradiator 2a and the substrate W1. Accordingly, the organic substance can be more effectively removed by an ultraviolet ray having a long peak wavelength.

<A Plurality of Devices>

In the above-described example, the ultraviolet irradiators 2 are provided for the single substrate holder 1 in the single substrate processing device 10. However, a plurality of ultraviolet irradiation devices may be individually provided to a plurality of devices. For example, the substrate processing device 10 includes a first device and a second device. The first device includes a first substrate holder and the ultraviolet irradiators 2a, and the second device includes a second substrate holder and the ultraviolet irradiators 2b. The substrate conveying means configured to convey the substrate W1 is provided between the first device and the second device. The ultraviolet irradiators 2a irradiate the substrate W1 being held by the first substrate holder with the ultraviolet ray having the wavelength λa to remove the organic substance thereon. When the irradiation by the ultraviolet irradiators 2a ends, the substrate conveying means conveys the substrate W1 from the first substrate holder to the second substrate holder. The ultraviolet irradiators 2b irradiate the substrate W1 being held by the second substrate holder with the ultraviolet ray having the wavelength λb to remove the organic substance thereon. In this manner, the organic substance can be disassembled and removed by both ultraviolet rays having the wavelengths λa and λb.

In the above-described example, the two kinds of ultraviolet irradiators 2a and 2b configured to emit ultraviolet rays in spectra different from each other are employed as the ultraviolet irradiators 2. However, three or more kinds of ultraviolet irradiators 2 may be employed. In this case, the organic substance in a wider range can be removed.

Second Preferred Embodiment

Figure 11:
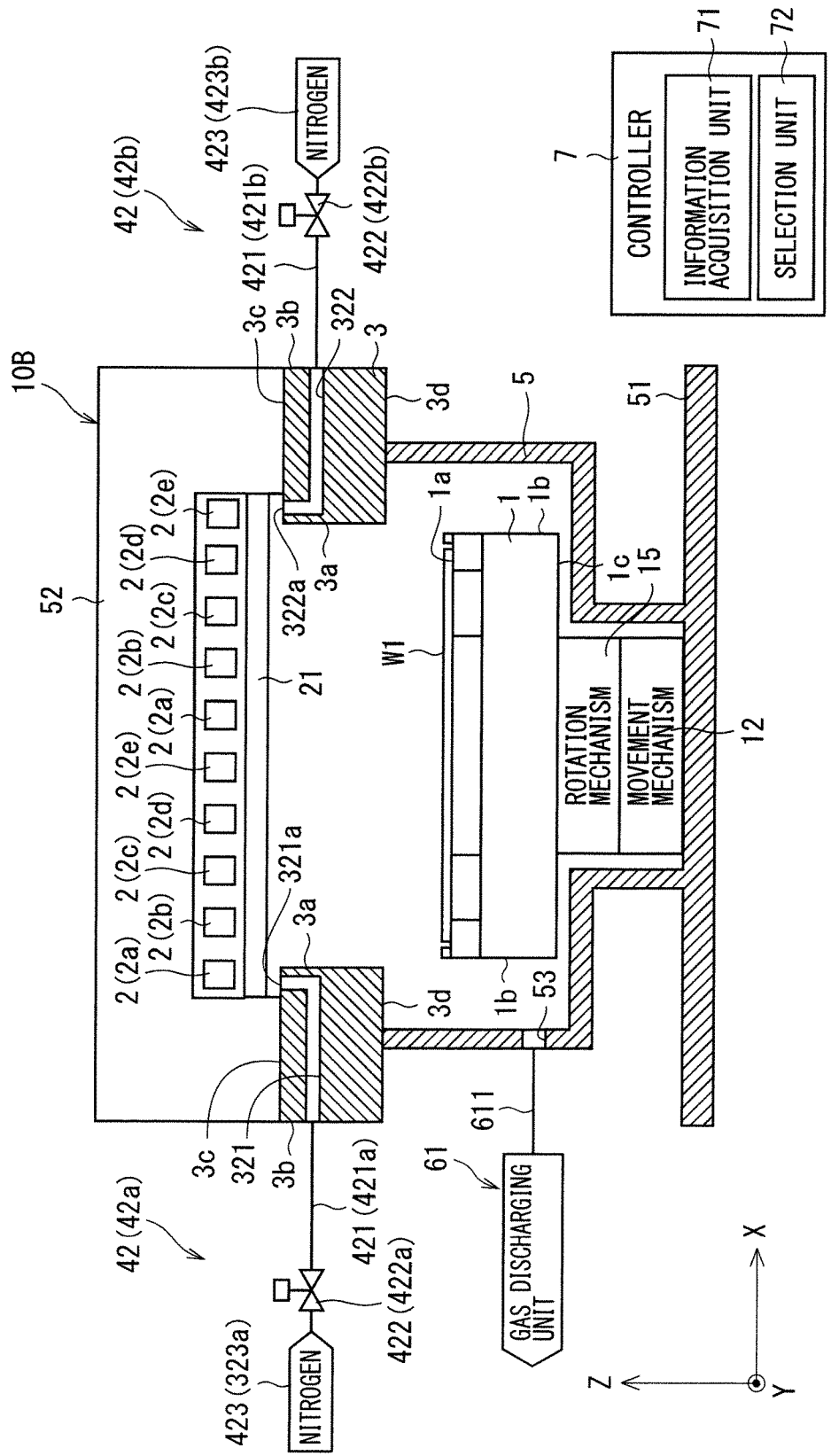
FIG. 11 is a diagram schematically illustrating an exemplary configuration of the substrate processing device.

FIG. 11 is a diagram illustrating an exemplary configuration of a substrate processing device 10B according to a second preferred embodiment. The substrate processing device 10B has a configuration same as that of the first preferred embodiment except for the ultraviolet irradiators 2 and the controller 7. In the first preferred embodiment, two or more kinds of ultraviolet irradiators 2 having spectra different from each other may be employed. In the second preferred embodiment, however, three or more kinds of ultraviolet irradiators 2 (in the example illustrated in FIG. 11, ultraviolet irradiators 2a to 2e) having spectra different from each other are provided. For simplification in the following description, the ultraviolet irradiators 2a to 2e each have a single peak wavelength. These peak wavelengths are also referred to as wavelengths λa to λe. The wavelengths λa to λe are shorter in alphabetical order of the reference signs. Specifically, the wavelength λa of the ultraviolet irradiator 2a is shortest, and the wavelength λe of the ultraviolet irradiator 2e is longest. For example, the wavelengths λa to λe of the ultraviolet irradiators 2a to 2e are 126 nm, 172 nm, 185 nm, 222 nm, and 254 nm, respectively.

In the first preferred embodiment, the controller 7 causes all ultraviolet irradiators 2 to emit ultraviolet rays in the organic substance removal processing. In the second preferred embodiment, however, the controller 7 selects two or more ultraviolet irradiators 2 used in the removal processing on the substrate W1, in accordance with the gap between the fine structures P1 on the substrate W1. The following describes a more specific selection method.

<Width of Gap Between Fine Structures P1>

Figure 12:
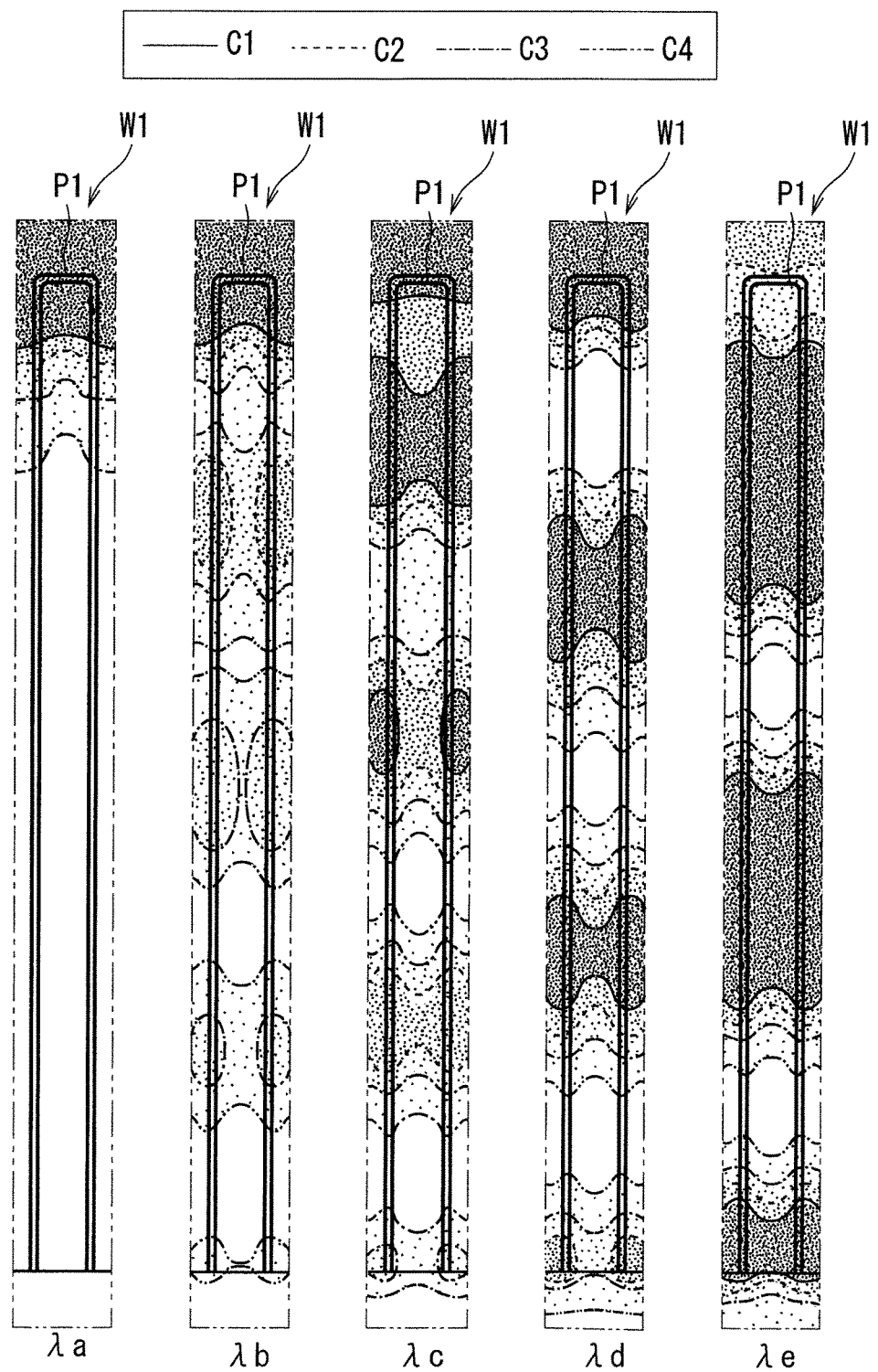
FIG. 12 is a contour diagram illustrating a schematic example of ultraviolet intensity.
Figure 13:
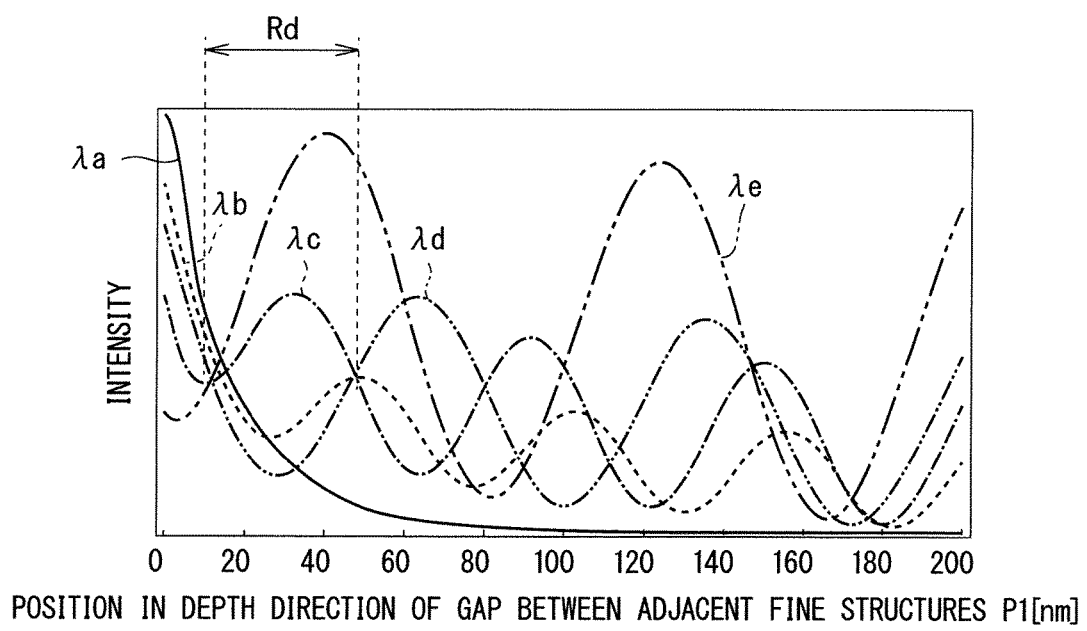
FIG. 13 is a graph illustrating a schematic example of ultraviolet intensity.
Figure 14:
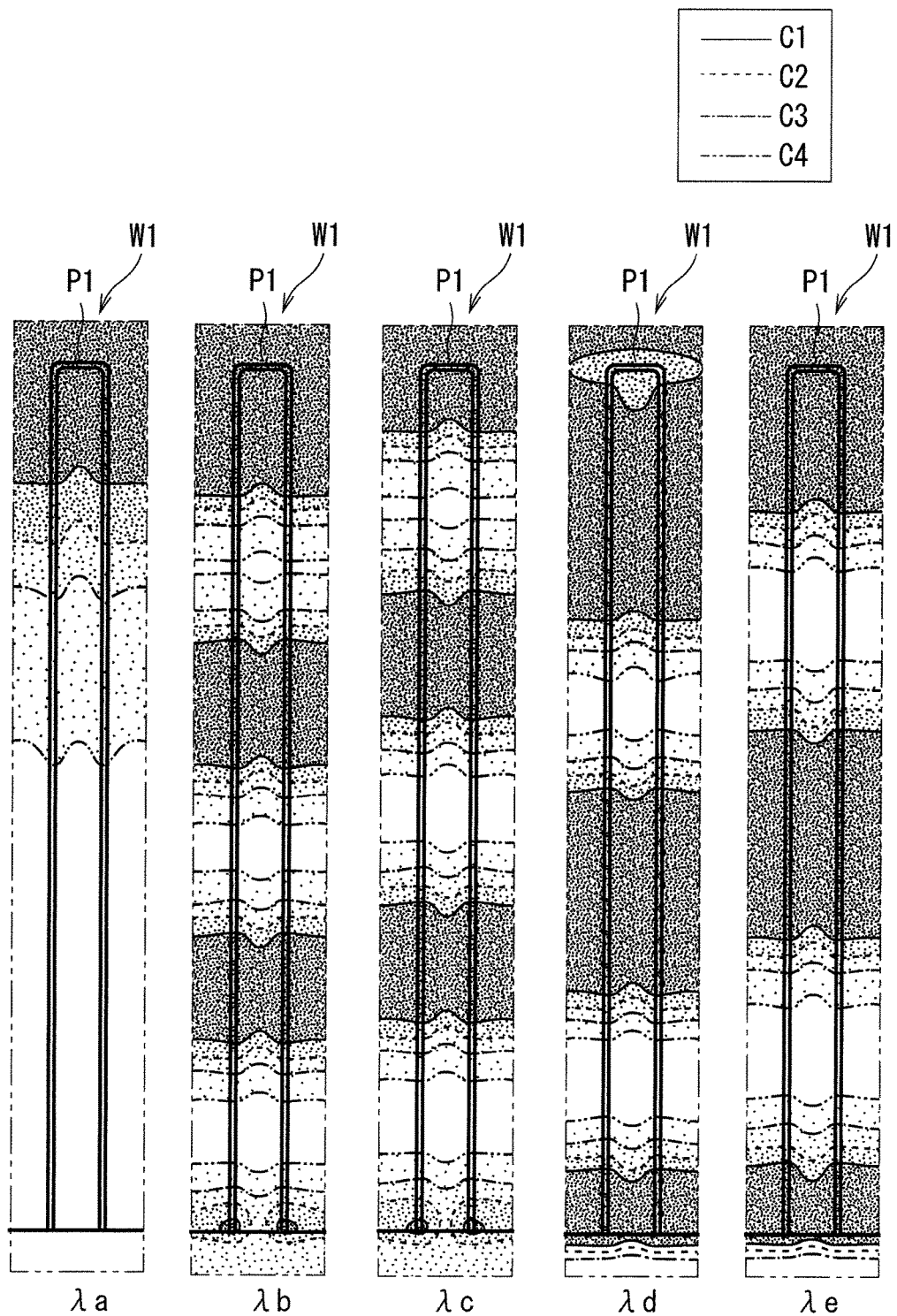
FIG. 14 is a contour diagram illustrating a schematic example of ultraviolet intensity.
Figure 15:
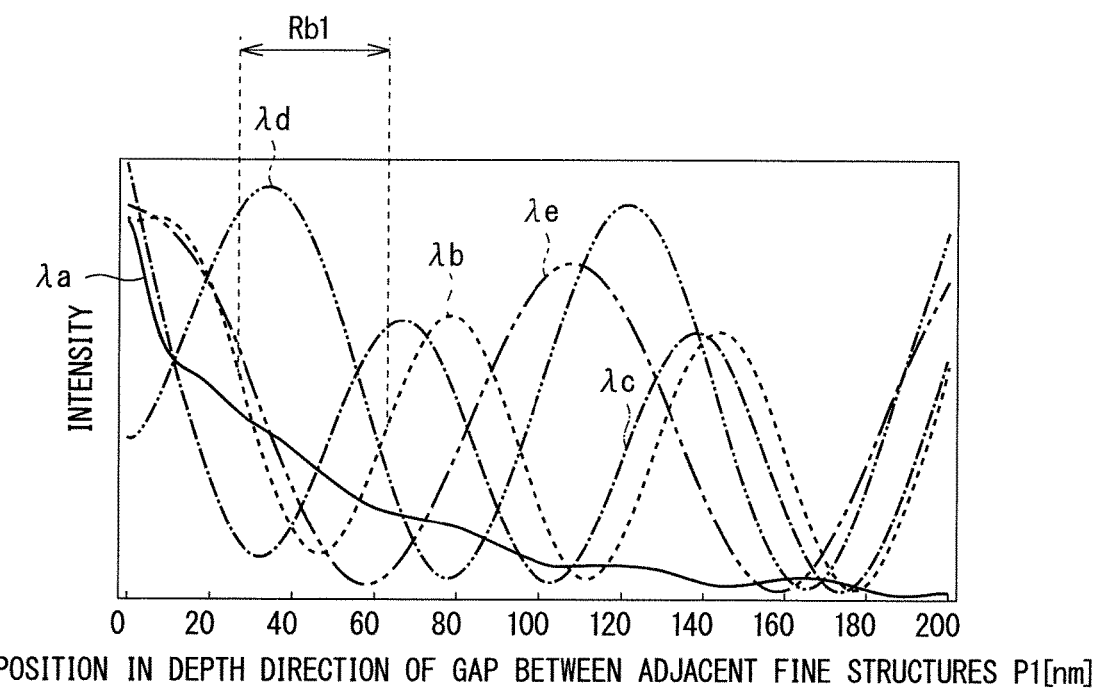
FIG. 15 is a graph illustrating a schematic example of ultraviolet intensity.
Figure 16:
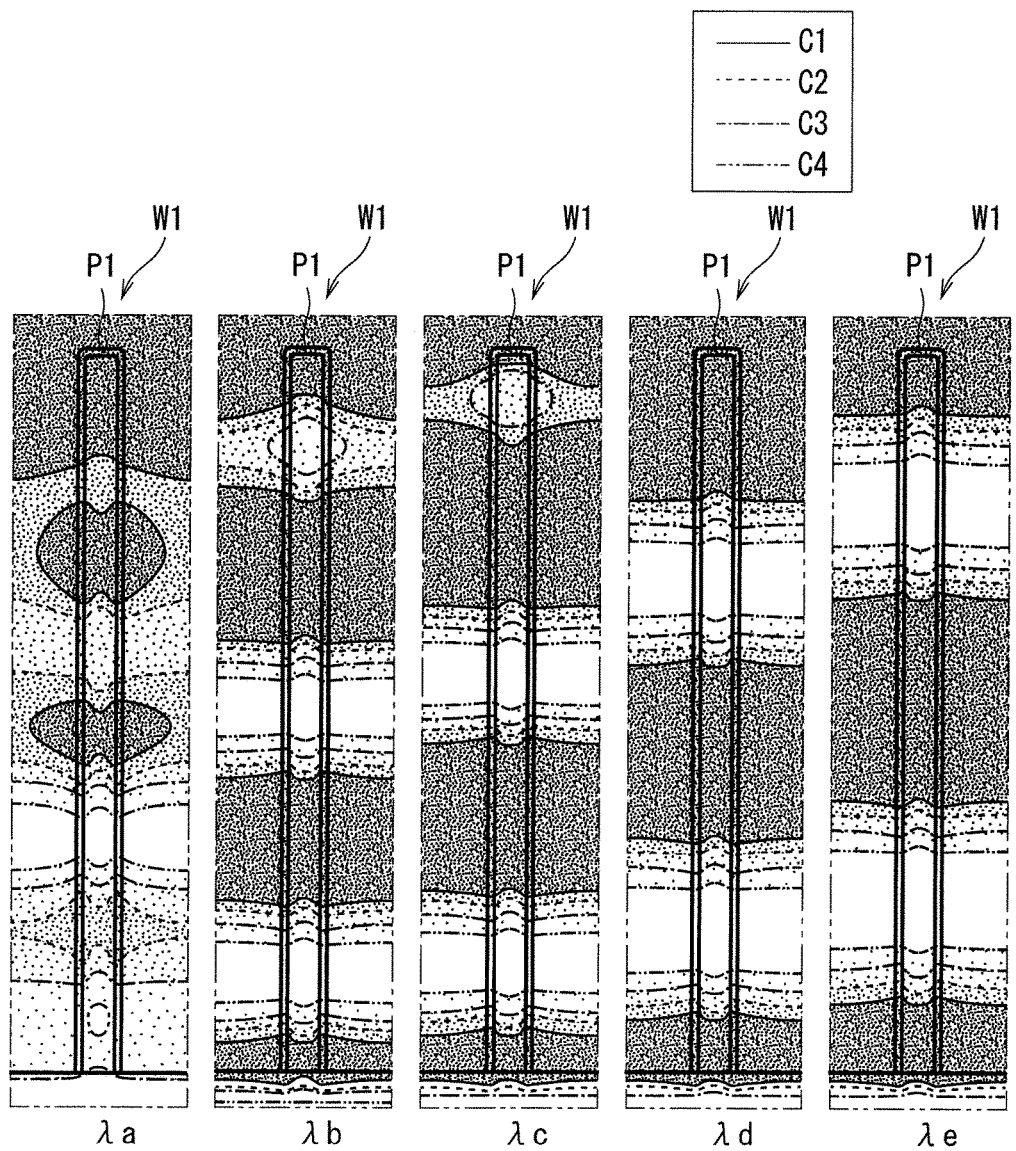
FIG. 16 is a contour diagram illustrating a schematic example of ultraviolet intensity.
Figure 17:
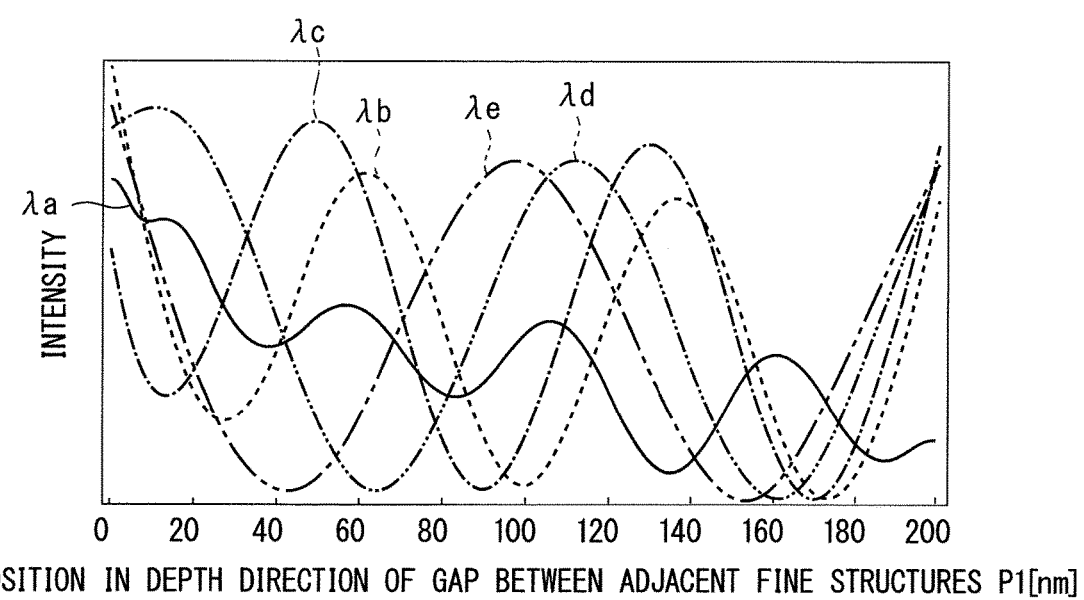
FIG. 17 is a graph illustrating a schematic example of ultraviolet intensity.

FIGS. 12 to 17 are each a diagram schematically illustrating an exemplary result of simulation of the intensity of an ultraviolet ray. FIGS. 12, 14, and 16 illustrate simulation results with different widths of the gap between the fine structures P1. In FIGS. 12, 14, and 16, the widths of the gap are 10 nm, 20 nm, and 40 nm, respectively. The width and height of each fine structure P1 are same as those in the case illustrated in FIG. 4, and are 10 nm and 200 nm, respectively. In each of FIGS. 12, 14, and 16, the intensity of an ultraviolet ray having a shorter wavelength is illustrated further on the left side. Specifically, the intensity of the ultraviolet ray having the wavelength $\lambda a$ (=126 nm) is illustrated furthest on the left side, and the intensity of an ultraviolet ray having the wavelength $\lambda e$ (=254 nm) is illustrated furthest on the right side. In each of FIGS. 12, 14, and 16, values of the intensity of an ultraviolet ray are indicated by contours C1 to C4. In addition, in each of FIGS. 12, 14, and 16, these values of the intensity of an ultraviolet ray are indicated with densities of sand hatching applied in regions and the absence thereof. A denser hatching indicates a higher ultraviolet intensity, and the intensity of an ultraviolet ray is lowest in a region in which no hatching is applied. FIGS. 13, 15, and 17 are graphs illustrating, for the respective wavelengths $\lambda a$ to $\lambda e$, the intensity of an ultraviolet ray at the side surface of the fine structure P1 illustrated in FIGS. 12, 14, and 16.

<Gap Width of 10 nm [m]>

As illustrated in FIGS. 12 and 13, when the gap between the fine structures P1 has a narrow width of 10 nm, the intensity of the ultraviolet ray having the shortest wavelength $\lambda a$ monotonically decreases with the depth position. Specifically, the intensity sharply decreases as the depth position changes from the upper end of the fine structure P1 toward the lower end thereof, and thereafter gradually becomes asymptotically equal to zero. This indicates that the ultraviolet ray having the wavelength $\lambda a$ hardly penetrates into the gap.

However, the intensities of the ultraviolet rays having the wavelengths $\lambda b$ to $\lambda e$ periodically vary as the depth position changes from the upper end of the fine structure P1 toward the lower end thereof, and peak values thereof tend to gradually decrease accordingly. The decrease of peak values is more significant for an ultraviolet ray having a shorter wavelength. For example, each peak value of the intensity of the ultraviolet ray having the wavelength $\lambda b$ is about half of the corresponding peak value of the intensity of the ultraviolet ray having the wavelength $\lambda c$. It is thought that the period of the variation depends on wavelength. Thus, a depth position where the intensity of an ultraviolet ray takes a peak value differs between the wavelengths $\lambda a$ to $\lambda e$, and a depth position where the intensity of an ultraviolet ray takes a bottom value differs between the wavelengths $\lambda a$ to $\lambda e$.

Simple description will be made on rules for determining which ultraviolet irradiator 2 is to be used. As a first rule, any ultraviolet irradiator 2 configured to emit an ultraviolet ray capable of sufficiently penetrating (entering) into the gap between the fine structures P1 is employed. As a second rule, any ultraviolet irradiator 2 configured to emit an ultraviolet ray having a short peak wavelength is preferentially employed from among the ultraviolet irradiators 2 configured to emit ultraviolet rays capable of penetrating into the gap. This is because an ultraviolet ray having higher photon energy can disconnect a larger number of kinds of molecular binding and remove the organic substance at an improved speed. As a third rule, two or more ultraviolet irradiators 2 configured to emit ultraviolet rays in spectra different from each other are employed. More specifically, two or more ultraviolet irradiators 2 capable of emitting ultraviolet rays that satisfy the condition described in <Wavelength selection> in the first preferred embodiment are employed. Accordingly, intensity insufficiency in the gap between the fine structures P1 can be effectively compensated between ultraviolet rays at peak wavelengths. Thus, the organic substance in a wider range can be removed. As a fourth rule, the number of ultraviolet irradiators 2 to be used is reduced to avoid power consumption by the ultraviolet irradiators 2, if possible.

FIG. 18 is a flowchart illustrating an exemplary ultraviolet irradiator selecting method based on these rules. At step S211, it is determined whether the intensity of an ultraviolet ray having a particular wavelength monotonically decreases in the depth direction of each fine structure P1. The determination can be performed by calculating the intensity of an ultraviolet ray by, for example, simulation or experiment. Upon the positive determination, it is determined whether the intensity at a predetermined depth position (for example, 40 nm) is higher than a reference value at step S212. When it is determined that the intensity is lower than the reference value, the wavelength is changed to a longer wavelength at step S213, and step S211 is executed again by using the changed wavelength. In other words, it is determined that an ultraviolet ray having a wavelength for which the negative determination is obtained at step S212 does not sufficiently penetrate into the gap between the fine structures P1, and then step S211 is executed on an ultraviolet ray having a longer wavelength.

When it is determined that the intensity is higher than the reference value at step S212, any ultraviolet irradiator 2 configured to emit an ultraviolet ray having the wavelength is selected at step S214. In other words, it is determined that an ultraviolet ray having the wavelength is capable of sufficiently penetrating into the gap between the fine structures P1, and any ultraviolet irradiator 2 configured to emit an ultraviolet ray having the wavelength is selected.

When the negative determination is obtained at step S211 or subsequently after step S214, it is determined whether any peak value of the intensity of an ultraviolet ray is higher than a reference value at step S215. Specifically, it is determined whether a minimum peak value is higher than the reference value. When it is determined that the peak value is lower than the reference value, step S213 is executed.

When it is determined that the peak value is higher than the reference value at step S215, steps S216 to S219 are executed. Steps S216 to S219 are identical to steps S103 and S201 to S203 in FIG. 7.

At step S220 subsequently after step S219, it is determined whether any ultraviolet irradiator 2 other than the already selected ultraviolet irradiator 2 needs to be selected. For example, it is determined that any other ultraviolet irradiator 2 is needed when the number of selected ultraviolet irradiators 2 is smaller than a predetermined number. When it is determined that any other ultraviolet irradiator 2 is needed, step S218 is executed. When it is determined that no other ultraviolet irradiator 2 is needed, the selection ends.

It is determined which the ultraviolet rays having the wavelengths $\lambda a$ to $\lambda e$ is to be used based on the above-described simulation result and the above-described rules as follows. Specifically, in the organic substance removal processing on the substrate W1 in which the width of the gap between the fine structures P1 is 10 nm approximately, ultraviolet rays having the wavelengths λa and λb are not used (NO at step S212 for the wavelength λa, and NO at step S215 for the wavelength λb). This is because the ultraviolet rays each have low intensity in the gap between the fine structures P1. In other words, it is determined not to use the ultraviolet rays having the wavelengths λa and λb based on the first rule.

Each peak value of the intensity of the ultraviolet ray having the wavelength λc is about twice as high as the corresponding peak value of the intensity of the ultraviolet ray having the wavelength λb (FIG. 13), and thus it can be thought that the ultraviolet ray having the wavelength λc sufficiently penetrates into the gap. According to the second rule, an ultraviolet ray having a shorter wavelength is more useful for organic substance removal. Thus, the ultraviolet ray having the wavelength λc is used in the organic substance removal processing on the substrate W1 (YES at step S215).

According to the third rule, such an ultraviolet ray is used that takes a peak value near a depth position at which the intensity of the ultraviolet ray having the wavelength λc takes a bottom value (in a region having a center at the depth position and extending over half the period of the ultraviolet ray having the wavelength λc). As illustrated in FIG. 13, near the depth position of 60 nm, the intensity of the ultraviolet ray having the wavelength λc takes a bottom value, but the intensity of the ultraviolet ray having the wavelength λd takes a peak value. Near the depth position of 120 nm, the intensity of the ultraviolet ray having the wavelength λc takes a bottom value, but the intensity of the ultraviolet ray having the wavelength λe takes a peak value. Thus, the ultraviolet rays having the wavelengths λd and λe are also used in the organic substance removal processing on the substrate W1 (YES at step S217).

In this manner, it is determined that the substrate W1 in which the gap between the fine structures P1 has a narrow width of 10 nm approximately is to be irradiated with ultraviolet rays by the ultraviolet irradiators 2c to 2e but not by the ultraviolet irradiators 2a and 2b. Accordingly, the organic substance in the gap between the fine structures P1 can be removed in a wider range while power consumption by the ultraviolet irradiators 2a and 2b is avoided.

<Gap Width of 20 nm>

The following describes a case in which the gap between the fine structures P1 has a width of 20 nm. As illustrated in FIGS. 14 and 15, the intensity of the ultraviolet ray having the shortest wavelength λa decreases with slight variation as the depth position changes from the upper end of the fine structure P1 toward the lower end thereof, which indicates that this ultraviolet ray hardly penetrates into the gap. In other words, the intensity of the ultraviolet ray having the wavelength λa periodically varies in the depth direction in the gap.

The intensities of the ultraviolet rays having the wavelengths λb to λe periodically vary the depth direction in the gap. The peak values of the ultraviolet rays having the wavelengths λb to λe gradually decrease as compared to the case illustrated in FIG. 13. Thus, the ultraviolet rays having the wavelengths λb to λe is likely to penetrate into the gap as compared to the case in which the gap has a width of 10 nm.

It is determined whether to use an ultraviolet ray based on the above-described simulation result and the above-described rules as follows. Specifically, in the removal processing on the substrate W1 in which the gap between the fine structures P1 has a width of 20 nm approximately, the ultraviolet ray having the wavelength λa is not used (NO at step S212 or step S215). This is because the ultraviolet ray has low intensity in the gap between the fine structures P1.

However, the ultraviolet rays having the wavelengths λb to λe can penetrate into the gap. Since an ultraviolet ray having a shorter wavelength is more useful for the organic substance removal, the ultraviolet ray having the wavelength λb is used (YES at step S215).

Such an ultraviolet ray is used that has a wavelength taking a peak value near a depth position where the intensity of the ultraviolet ray having the wavelength λb takes a bottom value (in a region having a center at the depth position and extending over half the period of the ultraviolet ray having the wavelength λb). For example, near the depth position of 110 nm, the intensity of the ultraviolet ray having the wavelength λb takes a bottom value, but the intensities of the ultraviolet rays having the wavelengths λd and λe take peak values. Thus, the ultraviolet rays having the wavelengths λd and λe may be used (YES at step S207). However, the intensities of the ultraviolet rays having the wavelengths λd and λe are substantially identical to each other at the depth position, and thus it can be thought that the ultraviolet ray having the shorter wavelength λd suffices. Thus, the ultraviolet ray having the wavelength λe is used in this example based on the fourth rule, too. This configuration can avoid power consumption by the ultraviolet irradiator 2e.

Figures 19, 20:
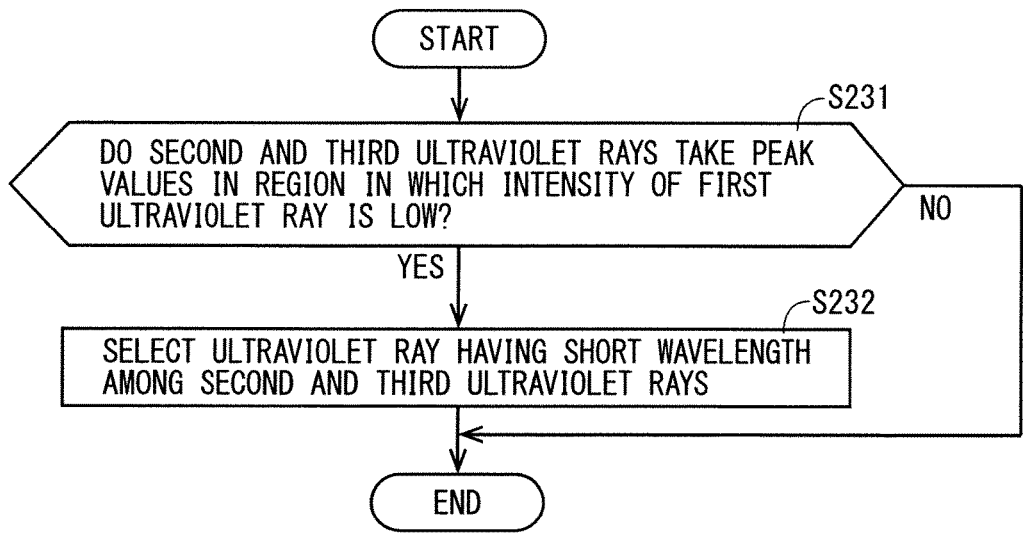
FIG. 19 is a flowchart illustrating an exemplary ultraviolet irradiator selecting method.
FIG. 20 is a diagram illustrating an exemplary relation between the width of each gap between fine structures of a substrate and the wavelength of an ultraviolet ray incident on the substrate.

FIG. 19 is a flowchart illustrating an exemplary selection method. At step S231, it is determined whether, in a region in which the intensity of a first ultraviolet ray (in this example, the ultraviolet ray having the wavelength λb) is low, the intensity of a second ultraviolet ray (in this example, the ultraviolet ray having the wavelength λd) and the intensity of a third ultraviolet ray (in this example, the ultraviolet ray having the wavelength λe) both take peak values. The first ultraviolet ray is emitted by the ultraviolet irradiator 2 selected at step S216. The region has a center at a depth position where the intensity of the first ultraviolet ray takes a bottom value and corresponds to half the period of the first ultraviolet ray. The second ultraviolet ray and the third ultraviolet ray are emitted by the ultraviolet irradiator 2 selected at step S219. Upon the positive determination at step S231, the ultraviolet irradiator 2 configured to emit the ultraviolet ray having the shorter wavelength (in this example, the wavelength λb) among the second ultraviolet ray and the third ultraviolet ray is selected, but the ultraviolet irradiator 2 configured to emit the ultraviolet ray having the longer wavelength (in this example, the wavelength λc) is not selected at step S232. With this configuration, insufficiency of the intensity of the first ultraviolet ray can be compensated by the second ultraviolet ray having the shorter wavelength so that the organic substance in the region is more effectively removed. In addition, since the ultraviolet irradiator 2 configured to emit the third ultraviolet ray is not selected, power consumption can be avoided accordingly.

Intensity insufficiency in a region (for example, near the depth position of 60 nm) in which the intensities of the ultraviolet rays having the wavelengths λb and λd are insufficient can be compensated by employing the ultraviolet ray having the wavelength λ. Thus, the ultraviolet ray having the wavelength λc may be employed. However, a depth position where the ultraviolet ray having the wavelength λc takes a peak value is relatively separated from a depth position where the ultraviolet ray having the wavelength λb takes a bottom value. Thus, the ultraviolet ray having the wavelength λc does not need to be employed when reduction of power consumption is prioritized. In this example, the ultraviolet ray having the wavelength λc is used too.

In this viewpoint, when an overlapping region of a first region and a second region in which the intensities of two ultraviolet rays are low, respectively, includes a peak value of the intensity of another ultraviolet ray, the intensity of the other ultraviolet ray may be selected.

As described above, when the gap between the fine structures P1 has a width of 20 nm approximately, ultraviolet rays are emitted by the ultraviolet irradiators 2b to 2d but not by the ultraviolet irradiators 2a and 2e in the organic substance removal processing. In this manner, the organic substance existing in the gap between the fine structures P1 can be removed in a wider range while power consumption by the ultraviolet irradiators 2a and 2e is avoided.

<Gap Width of 40 nm>

The following describes a case in which the gap between the fine structures P1 has a width of 40 nm. As illustrated in FIGS. 16 and 17, the ultraviolet ray having the shortest wavelength λa repeatedly varies and peak values thereof tend to gradually decrease as the depth position changes from the upper end of the fine structure P1 toward the lower end thereof. The peak values of the ultraviolet ray having the wavelength λa are equivalent to the peak values of the ultraviolet ray having the wavelength λc illustrated in FIG. 13. Thus, it can be thought that the ultraviolet ray having the wavelength λa penetrates into the gap.

The intensities of the ultraviolet rays having the wavelengths λb to λe periodically vary in the depth direction. Peak values of the intensity of each ultraviolet ray are about twice as high as peak values of the ultraviolet ray having the wavelength λa. Thus, the ultraviolet rays having the wavelengths λb to λe sufficiently penetrate into the gap.

It is selected whether to use an ultraviolet ray based on the above-described simulation result and the above-described rules as follows. Specifically, in the organic substance removal processing on the substrate W1 in which the gap between the fine structures P1 has a width of 40 nm approximately, the ultraviolet ray having the shortest wavelength λa is used (YES at step S215 illustrated in FIG. 18). The ultraviolet ray having the wavelength λb takes a peak value near the depth position of 140 nm, where the intensity of the ultraviolet ray having the wavelength λa takes a bottom value. Thus, the ultraviolet ray having the wavelength λb is used in the organic substance removal processing (YES at step S217). Accordingly, insufficiency of the intensity of the ultraviolet ray having the wavelength λa near the depth position can be compensated.

The ultraviolet ray having the wavelength λc takes a peak value near the depth position of 140 nm. Thus, the ultraviolet ray having the wavelength λc may be used (YES at step S217). In this example, the ultraviolet ray having the wavelength λc is used. In this region, however, insufficiency of the intensity of the ultraviolet ray having the wavelength λa can be compensated by the ultraviolet ray having the shorter wavelength λb. Thus, the ultraviolet ray having the wavelength λc does not need to be used (step S232 illustrated in FIG. 19) when reduction of power consumption is prioritized.

The ultraviolet ray having the wavelength λd may be used. However, as illustrated FIG. 17, the ultraviolet ray having the wavelength λd does not effectively compensate insufficiency of the intensity of the ultraviolet ray having the wavelength λa. Thus, in this example, the ultraviolet ray having the wavelength λd is not used so that reduction of power consumption is prioritized. Although the ultraviolet ray having the wavelength λe may be used, it can be thought that intensity insufficiency is sufficiently compensated between the ultraviolet rays having the wavelengths λa to λc. Thus, in this example, the ultraviolet ray having the wavelength λe is not used so that power consumption is prioritized (NO at step S220 illustrated in FIG. 18).

As described above, when the gap between the fine structures P1 has a width of 40 nm approximately, ultraviolet rays are emitted by the ultraviolet irradiators 2a to 2c but not by the ultraviolet irradiators 2d and 2e in the organic substance removal processing. Accordingly, the organic substance existing in the gap between the fine structures P1 can be removed in a wider range while power consumption by the ultraviolet irradiators 2d and 2e is avoided.

FIG. 20 is a diagram illustrating an exemplary relation between the width of the gap between the fine structures P1 formed on the surface of the substrate W1 and the wavelength of an ultraviolet ray incident on the substrate W1. In FIG. 20, a circle indicates that the corresponding ultraviolet ray is used in the organic substance removal processing, a cross indicates that the corresponding ultraviolet ray is not used, a triangle indicates that the corresponding ultraviolet ray may be used or not.

<Controller>

The following describes the configuration of the controller 7 configured to perform the above-described selection operation. As illustrated in FIG. 11, the controller 7 includes an information acquisition unit 71 and a selection unit 72. The information acquisition unit 71 acquires substrate information that is information on the substrate W1 to be processed. For example, the substrate information may be input by a worker in advance and stored in the storage unit (for example, ROM) of the controller 7, or may be received from a device upstream thereof through communication. The substrate information may include, for example, identification information for identifying the substrate W1. In addition, the substrate information may include information (specifically, the width of the gap) on the gap between the fine structures P1 formed on the substrate W1.

The selection unit 72 selects which ultraviolet irradiator 2 is to be used based on the substrate information. For example, a table illustrated in FIG. 20 may be stored as table information in the storage medium (for example, ROM) of the controller 7. The selection unit 72 may select which ultraviolet irradiator 2 is to be used by referring to the substrate information and the table information. Alternatively, a relational expression representing the relation between the width of the gap and the wavelength of an ultraviolet ray may be defined to select an ultraviolet ray having a wavelength nearest to a wavelength calculated based on the relational expression.

Various kinds of processing are performed on the substrate W1 in preprocessing and postprocessing of the substrate processing device 10. For example, etching processing, cleaning processing, and dry processing are performed in the preprocessing of the substrate processing device 10. In these kinds of processing, processing conditions (processing recipes) in accordance with the size of each fine structure P1 are employed. The width of the gap between the fine structures P1 can be estimated based on these processing conditions. Thus, the information acquisition unit 71 may acquire information indicating conditions of processing performed on the substrate W1. In this case, table information that associates a processing condition with an ultraviolet irradiator 2 to be used may be stored.

In other words, the information acquisition unit 71 may acquire information that changes in accordance with the width of the fine structure P1, and the selection unit 72 may select any ultraviolet irradiator 2 based on this information.

<Operation of Substrate Processing Device 10>

Figure 21:
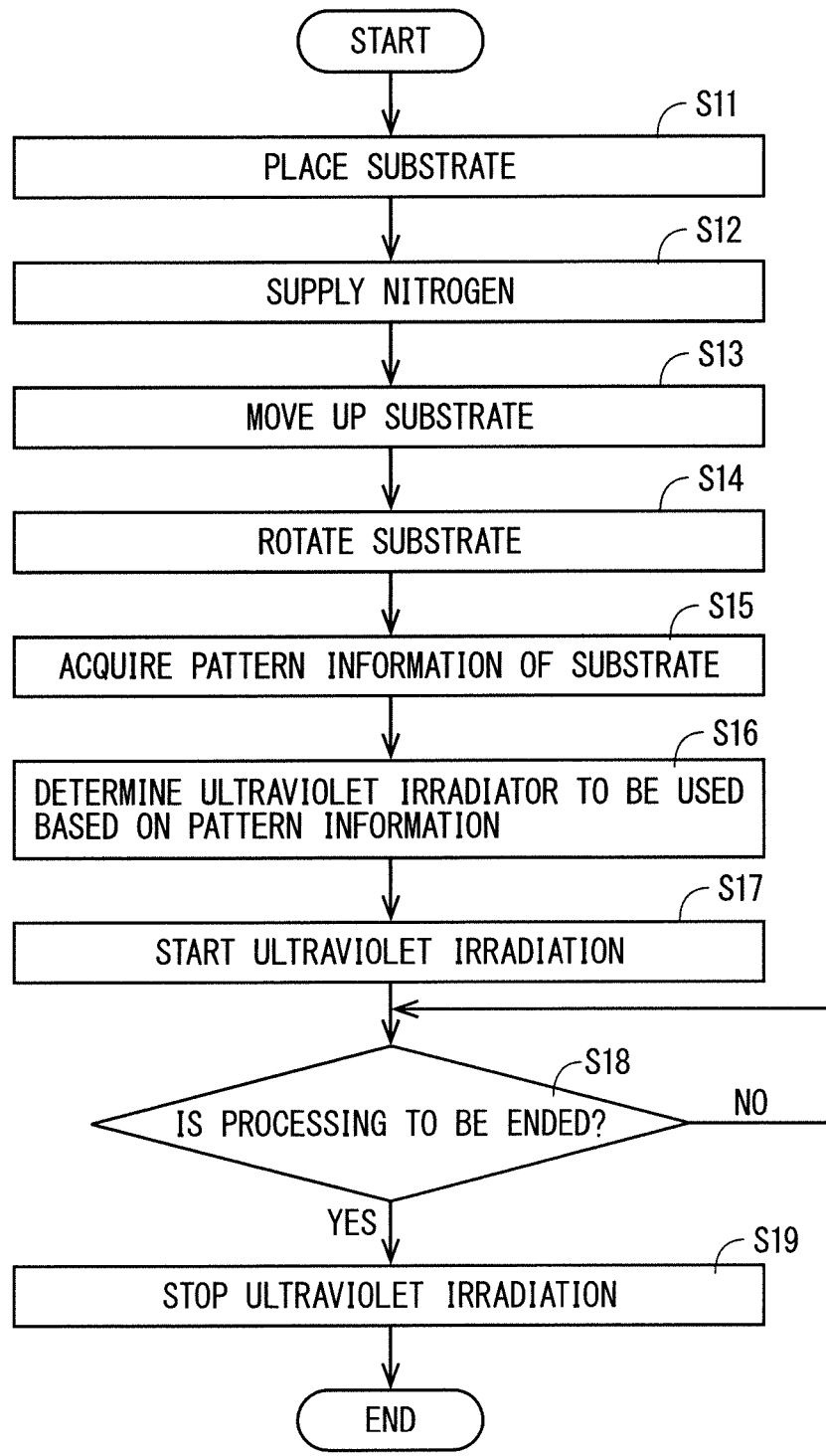
FIG. 21 is a flowchart illustrating an exemplary operation of the substrate processing device.

FIG. 21 is a diagram illustrating an exemplary operation of the substrate processing device 10B. Steps S11 to S14 are identical to steps S1 to S4, respectively. At step S15 following step S14, the information acquisition unit 71 acquires the substrate information of the substrate W1 being held by the substrate holder 1. The substrate information may include, for example, information indicating the width of the gap between the fine structures P1.

Subsequently at step S16, the selection unit 72 selects which ultraviolet irradiator 2 is to be used based on the substrate information. As a specific example, the selection unit 72 selects the ultraviolet irradiators 2c to 2e when the width of the gap between the fine structures P1 is smaller than a first width reference value (for example, 15 nm). In other words, the selection unit 72 determines not to use the ultraviolet irradiators 2a and 2b but to use the ultraviolet irradiators 2c to 2e. The selection unit 72 selects the ultraviolet irradiators 2b to 2d when the width of the gap is larger than the first width reference value and smaller than a second width reference value (for example, 30 nm). In other words, the selection unit 72 determines not to use the ultraviolet irradiators 2a and 2e but to use the ultraviolet irradiators 2b to 2d. The selection unit 72 selects the ultraviolet irradiators 2a to 2c when the width of the gap is larger than the second width reference value. In other words, the selection unit 72 determines not to use the ultraviolet irradiators 2d and 2e but to use the ultraviolet irradiators 2a to 2c.

Steps S15 and S16 do not necessarily need to be executed after step S14, but may be executed before step S17.

At step S17, the controller 7 causes the selected ultraviolet irradiators 2 to start ultraviolet irradiation. Accordingly, the main surface of the substrate W1 is irradiated with appropriate ultraviolet rays in accordance with the width of the gap between the fine structures P1, and the organic substance existing in the gap can be disassembled and removed in a wider range with low power consumption.

Steps s18 and S19 are identical to steps S6 and S7, respectively.

<Conceptual Description of Selection Operation>

More general description will be made next on the above-described selection operation. In this description, first to third ultraviolet irradiators are introduced. For correspondence description to the table illustrated in FIG. 20, the first to third ultraviolet irradiators are assumed to be, for example, the ultraviolet irradiators 2b, 2d, and 2e, respectively. Hereinafter, the first to third ultraviolet irradiators are denoted by reference signs 2b, 2d, and 2e in parentheses as appropriate. In addition, the wavelengths of ultraviolet rays emitted by the first to third ultraviolet irradiators are denoted by the reference signs in parentheses in a similar manner. The reference signs are used to facilitate understanding, and do not limit the first to third ultraviolet irradiators to the ultraviolet irradiators 2b, 2d, and 2e, respectively.

The first ultraviolet irradiator (2b) emits an ultraviolet ray in a spectrum including a first peak wavelength ($\lambda$b). The second ultraviolet irradiator (2d) emits an ultraviolet ray in a spectrum including a second peak wavelength ($\lambda$d) longer than the first peak wavelength ($\lambda$b). The third ultraviolet irradiator (2e) emits an ultraviolet ray in a spectrum including a third peak wavelength ($\lambda$e) longer than the first peak wavelength ($\lambda$b) and different from the second peak wavelength ($\lambda$d).

<Case with Narrow Gap Between Fine Structures>

In the selection operation, when the substrate W1 has a narrow gap (for example, 10 nm) between the fine structures P1, the selection unit 72 does not select the first ultraviolet irradiator (2b) but selects the second ultraviolet irradiator (2d) and the third ultraviolet irradiator (2e) (YES at steps S215 and S217 illustrated in FIG. 18). Since the ultraviolet ray having the short first peak wavelength ($\lambda$b) is unlikely to penetrate into a narrow gap as compared to the other ultraviolet rays, it is determined not to use the first ultraviolet irradiator (2b) to avoid power consumption by the first ultraviolet irradiator (2b) (NO at step S212 or step S215).

With this selection, intensity insufficiency in the gap between the fine structures P1 can be compensated between the ultraviolet ray emitted by the second ultraviolet irradiator (2d) and having the second peak wavelength ($\lambda$d) and the ultraviolet ray emitted by the third ultraviolet irradiator (2e) and having the third peak wavelength ($\lambda$e). Accordingly, the organic substance in the gap between the fine structures P1 can be removed in a wider range.

As illustrated in FIG. 11, the intensity of an ultraviolet ray emitted by the third ultraviolet irradiator (2e) and having the third peak wavelength ($\lambda$e) desirably takes a peak value in a region (Rd) having a center at a depth position (for example, 30 nm approximately) where the intensity of an ultraviolet ray emitted by the second ultraviolet irradiator (2d) and having the second peak wavelength ($\lambda$d) takes a bottom value, and having a width equal to half of the variation period of the ultraviolet ray. Accordingly, intensity insufficiency can be more effectively compensated between these ultraviolet rays.

<Case with Wider Gap Between Fine Structures>

When the substrate W1 has a wide gap between the fine structures P1 (for example, 20 nm), the selection unit 72 selects the first ultraviolet irradiator (2b) (YES at step S212 or step S215) and the second ultraviolet irradiator (2d) (YES at step S217).

In this manner, the first ultraviolet irradiator (2b) configured to emit an ultraviolet ray that is more likely to penetrate into the gap is used for the substrate W1 having a wide gap between the fine structures P1, thereby more effectively removing the organic substance by an ultraviolet ray having the short first peak wavelength ($\lambda$b). In addition, ultraviolet intensity insufficiency in the gap between the fine structure P1 is compensated between ultraviolet rays from the first ultraviolet irradiator (2b) and the second ultraviolet irradiator (2d). Accordingly, the organic substance in the gap between the fine structures P1 can be removed in a wider range.

As illustrated in FIG. 13, the intensity of the ultraviolet ray having the second peak wavelength ($\lambda$d) desirably takes a peak value in a region (for example, Rb1) having a center at a depth position (for example, 45 nm approximately) where the intensity of the ultraviolet ray having the first peak wavelength ($\lambda$b) takes a bottom value, and having a width equal to half of the variation period of the ultraviolet ray. Accordingly, intensity insufficiency is more effectively compensated between these ultraviolet rays.

The third ultraviolet irradiator (2e) may emit no ultraviolet ray (NO at step S220). Accordingly, power consumption can be reduced.

<Depth of Gap Between Fine Structures P1>

Figure 22:
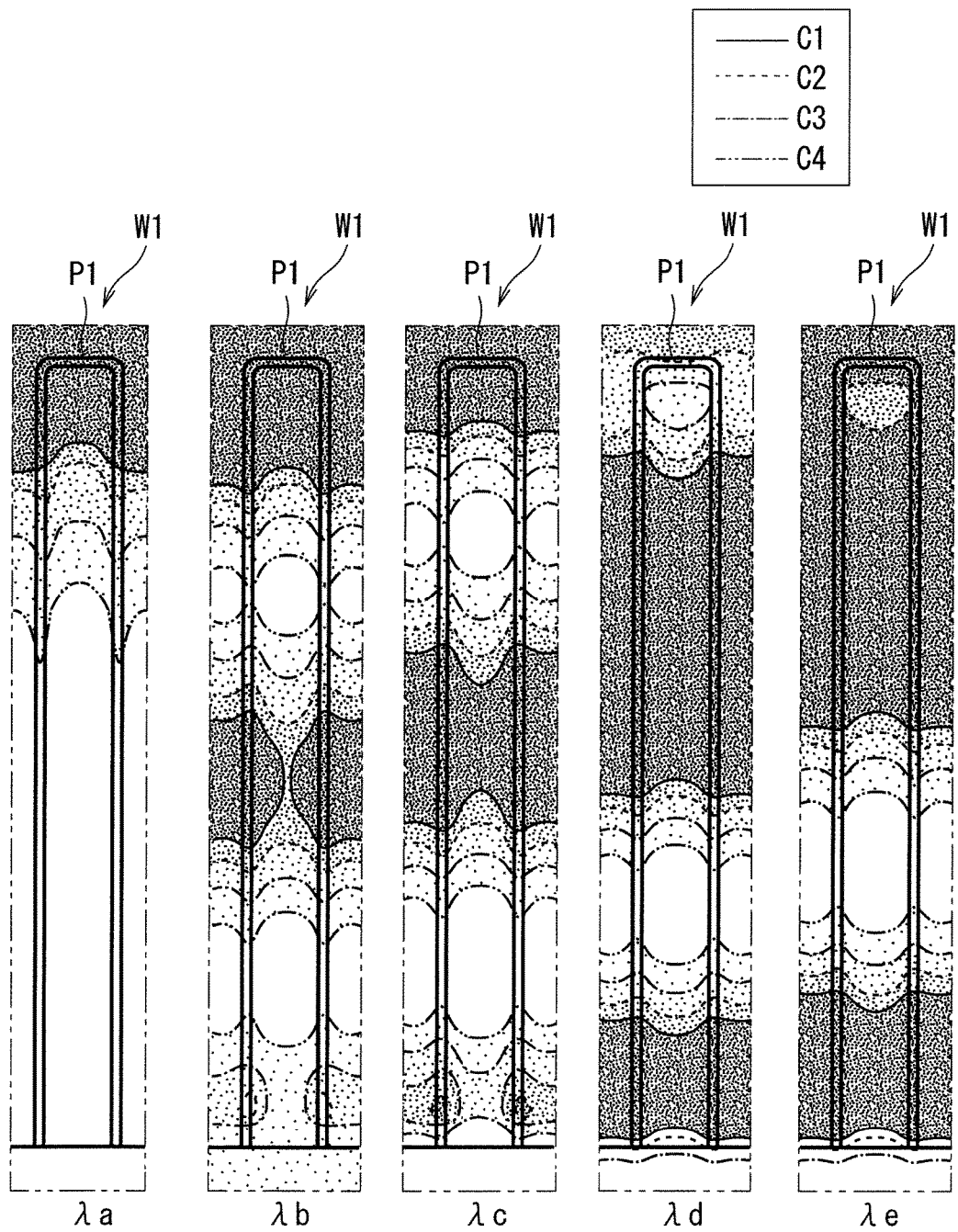
FIG. 22 is a contour diagram illustrating a schematic example of ultraviolet intensity.
Figure 23:
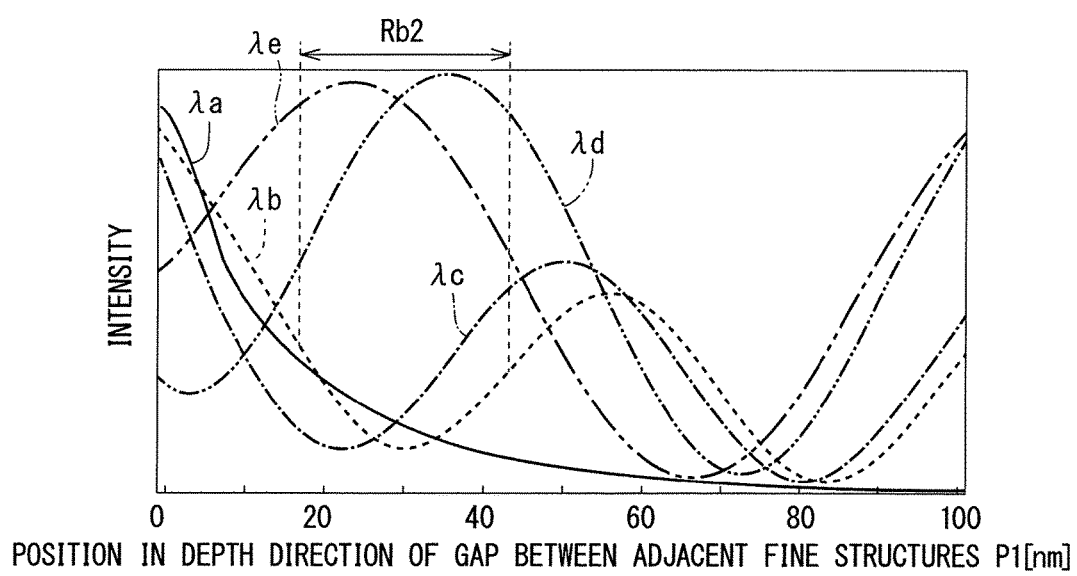
FIG. 23 is a graph illustrating a schematic example of ultraviolet intensity.
Figure 24:
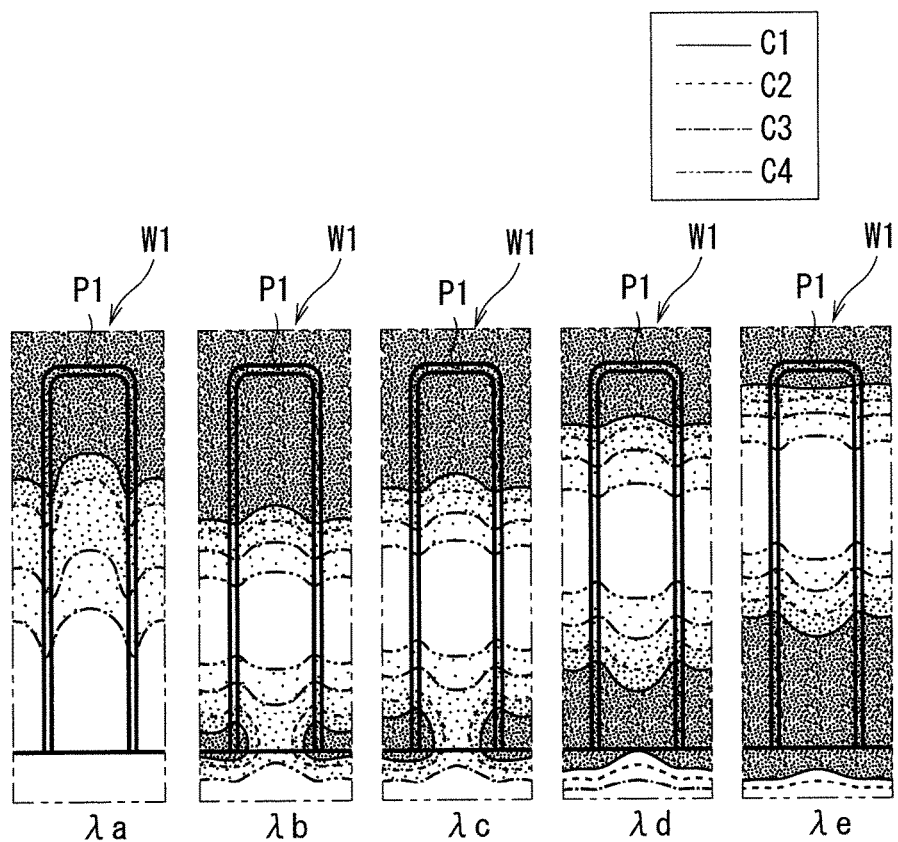
FIG. 24 is a contour diagram illustrating a schematic example of ultraviolet intensity.
Figure 25:
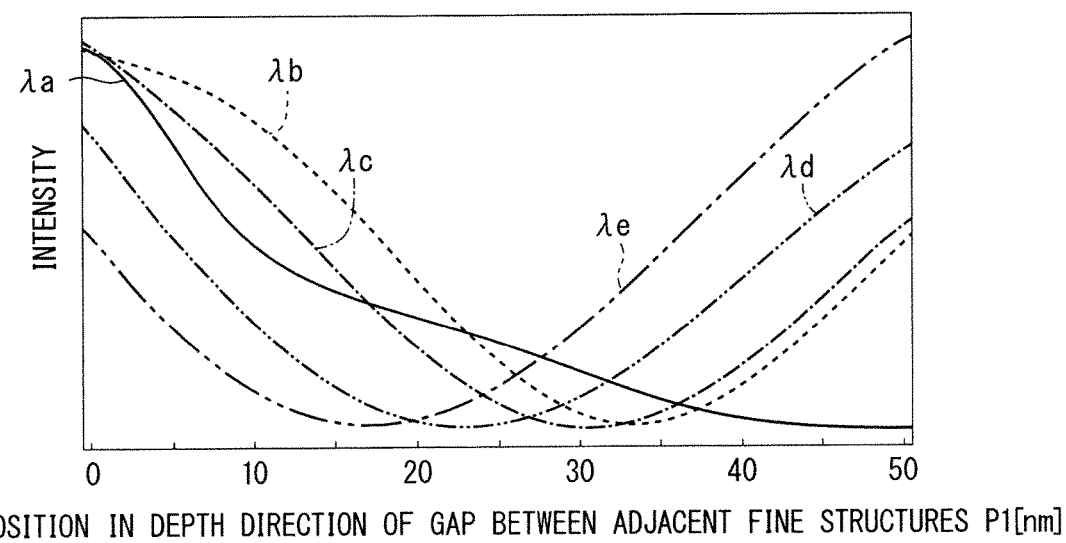
FIG. 25 is a graph illustrating a schematic example of ultraviolet intensity.

FIGS. 22 to 25 are each a diagram schematically illustrating an exemplary ultraviolet intensity simulation result. FIGS. 22 and 24 illustrate simulation results for different depths of the gap between the fine structures P1. The depths of the gap in FIGS. 22 and 24 are 100 nm and 50 nm, respectively. FIGS. 23 and 25 are graphs illustrating, for the wavelengths λa to λe, the intensities of ultraviolet rays at the side surface of each fine structure P1 of illustrated in FIGS. 22 and 24, respectively. Since the depth of the gap is 100 nm in FIG. 23, the horizontal axis ranges from 0 nm to 100 nm. In FIG. 25, the horizontal axis ranges from 0 nm to 50 nm. The width of the fine structure P1 and the width of the gap between the fine structures P1 are same as those in the case illustrated in FIG. 12. Specifically, the width of the fine structure P1 is 10 nm, and the width of the gap is 10 nm. Thus, FIGS. 12, 13, and 22 to 25 illustrate simulation results for different heights (=gap depths) of the fine structure P1.

<Gap Depth of 200 nm>

The case in which the gap between the fine structures P1 has a depth of 200 nm is described above with reference to FIGS. 12 and 13, and thus any duplication description thereof will be omitted.

<Gap Depth of 100 nm>

The following describes a case in which the gap between the fine structures P1 has a depth of 100 nm. As illustrated in FIGS. 22 and 23, the intensity of the ultraviolet ray having the shortest wavelength λa decreases as the depth position changes from the upper end of the fine structure P1 toward the lower end thereof. This is because the ultraviolet ray having the short wavelength λa is unlikely to diffract and thus penetrate into a narrow gap (having a width of 10 nm in this example).

However, the intensities of the ultraviolet rays having the wavelengths λb to λe periodically vary in the depth direction of the gap, and have high peak values. Thus, the ultraviolet rays having the wavelengths λa to λe can penetrate into the gap. The peak values of the ultraviolet rays having the wavelengths λb and λc are about half of the peak values of the ultraviolet rays having the wavelengths λd and λe.

The above-described rules apply to determination of which ultraviolet ray is to be used in the organic substance removal processing. Thus, for the substrate W1 having a gap depth of 100 nm approximately, any ultraviolet ray to be used in the organic substance removal processing thereon is selected as follows. Specifically, the ultraviolet ray having the wavelength λa is unlikely to penetrate into the gap and thus not used (NO at step S212 illustrated in FIG. 18). The ultraviolet ray having the shortest wavelength λb among the wavelengths of ultraviolet rays capable of penetrating into the gap is used (YES at step S215). In addition, the ultraviolet ray having the wavelength λd, which takes a peak value near the depth position of 30 nm where the intensity of the ultraviolet ray having the wavelength λb takes a bottom value, is used (YES at step S217). The ultraviolet ray having the wavelength λc may be used, but does not compensate effectively insufficiency of the intensity of the ultraviolet ray having the wavelength λb. Thus, in this example, the ultraviolet ray having the wavelength λc is not used so that reduction of power consumption is prioritized (NO at step S217). The ultraviolet ray having the wavelength λe, which compensates insufficiency of the intensity of the ultraviolet ray having the wavelength λb near the depth position of 30 nm, may be used (YES at step S217). However, in this region, the insufficiency of the intensity of the ultraviolet ray having the wavelength λb can be compensated by the ultraviolet ray having the shorter wavelength λd, and thus the ultraviolet ray having the wavelength λe does not need to be used (step S232 illustrated in FIG. 19). In this example, the ultraviolet ray having the wavelength λe is not used.

As described above, when the gap between the fine structures P1 has a depth of 100 nm approximately, it is determined that ultraviolet rays are to be emitted by the ultraviolet irradiators 2b and 2d but not by the ultraviolet irradiators 2a, 2c, and 2e in the organic substance removal processing. Accordingly, the organic substance existing in the gap between the fine structures P1 can be removed in a wider range while power consumption by the ultraviolet irradiators 2a, 2c, and 2e is avoided.

<Gap Depth of 50 nm>

The following describes a case in which the gap between the fine structures P1 has a depth of 50 nm. As illustrated in FIGS. 24 and 25, the intensity of the ultraviolet ray having the shortest wavelength λa decreases as the depth position changes from the upper end of the fine structure P1 toward the lower end thereof. This is because the ultraviolet ray having the short wavelength λa is unlikely to diffract and thus penetrate into a narrow gap (having a width of 10 nm in this example).

However, since the gap has a shallow depth of 50 nm, the penetration distance of an ultraviolet ray is relatively long for the depth of the gap. For example, as illustrated in FIGS. 13, 23, and 25, the intensity of the ultraviolet ray having the wavelength λa at the depth position of 20 nm is substantially constant irrespective of the depth of the gap between the fine structures P1. When the depth position is regarded as the penetration distance of the ultraviolet ray having the wavelength λa, the penetration distance is short relative to the deep gap depth of 200 nm (FIG. 13). Specifically, the ultraviolet ray having the wavelength λa penetrates only to one tenth (=penetration distance of 20 nm/gap depth of 200 nm) of the entire gap. However, the penetration distance is long relative to the shallow gap depth of 50 nm (FIG. 25). Specifically, the ultraviolet ray having the wavelength λa penetrates to two fifth (=penetration distance of 20 nm/gap depth of 50 nm) of the entire gap. Thus, in this case, it can be thought that the ultraviolet ray having the wavelength λa can sufficiently penetrate into the gap.

The intensities of the ultraviolet rays having the wavelengths λb to λe vary in the depth direction of the gap and take sufficiently high values. Thus, the ultraviolet rays having the wavelengths λa to λe can penetrate into the gap. As described above, it can be thought that, when the gap is shallow, all the ultraviolet rays having the wavelengths λa to λe penetrate into the gap.

Ultraviolet rays are selected based on the above-described simulation result and the above-described rules as follows. Specifically, in the organic substance removal processing on the substrate W1 in which the gap between the fine structures P1 has a depth of 50 nm approximately, the ultraviolet rays having the wavelengths λa and λe are used, but the ultraviolet rays having the wavelengths λb to λc are not used. Thus, the ultraviolet ray having the shortest wavelength λa is used (step S100 illustrated in FIG. 6), and the ultraviolet ray having the wavelength λe and having a high intensity in a region in which the intensity of the ultraviolet ray is low is used (step S200 illustrated in FIG. 6). The ultraviolet rays having the wavelengths λb to λc may be used, but in this example, the ultraviolet rays having the wavelengths λb to λc are not used so that reduction of power consumption is prioritized.

As described above, when the gap between the fine structures P1 has a depth of 50 nm approximately, ultraviolet rays are emitted by the ultraviolet irradiators 2a and 2e but not by the ultraviolet irradiators 2b to 2d in the organic substance removal processing. Accordingly, the organic substance existing in the gap between the fine structures P1 can be removed in a wider range while power consumption by the ultraviolet irradiators 2b to 2c is avoided.

FIG. 26 is a diagram illustrating an exemplary relation between the depth of the gap between the fine structures P1 formed on the surface of the substrate W1 and the wavelength of an ultraviolet ray incident on the substrate W1.

<Operation of Substrate Processing Device 10B>

An exemplary specific operation of the substrate processing device 10B is same as that illustrated in FIG. 21. However, the substrate information of the substrate W1 includes information indicating the depth of the gap between the fine structures P1. At step S16, the selection unit 72 selects which ultraviolet irradiator 2 to be used in accordance with this depth information as described above. Specifically, the selection unit 72 determines not to use the ultraviolet irradiators 2a and 2b but to use the ultraviolet irradiators 2c to 2e when the depth of the gap between the fine structures P1 is deeper than a first depth reference value (for example, 150 nm). The selection unit 72 determines not to use the ultraviolet irradiators 2a, 2c, and 2e but to use the ultraviolet irradiators 2b and 2d when the depth of the gap is shallower than the first depth reference value and deeper than a second depth reference value (for example, 75 nm). The selection unit 72 determines not to use the ultraviolet irradiators 2c to 2d but to use the ultraviolet irradiators 2a and 2e when the depth of the gap is shallower the second depth reference value.

<Conceptual Description of Selection Operation>

More general description will be made next on the above-described selection operation. In this description, too, first to third ultraviolet irradiators are introduced. For correspondence description to the table illustrated in FIG. 26, this example focuses on the ultraviolet irradiators 2b to 2d configured to emit ultraviolet rays having the wavelengths λb to λd, respectively. Specifically, the ultraviolet irradiator 2b is assumed as an example of the first ultraviolet irradiator, the ultraviolet irradiator 2d is assumed as an example of the second ultraviolet irradiator, and the ultraviolet irradiator 2c is assumed as an example of the third ultraviolet irradiator.

The first ultraviolet irradiator (2b) emits an ultraviolet ray in a spectrum including the first peak wavelength (λb). The second ultraviolet irradiator (2d) emits an ultraviolet ray in a spectrum including the second peak wavelength (λd) longer than the first peak wavelength (λb). The third ultraviolet irradiator (2c) emits an ultraviolet ray in a spectrum including the third peak wavelength (λc) longer than the first peak wavelength (λb) and different from the second peak wavelength (λd).

<Case with Deep Gap Between Fine Structures>

In the selection operation, when the substrate W1 has a deep gap (for example, 200 nm) between the fine structures P1, the selection unit 72 determines that the substrate W1 is not to be irradiated with an ultraviolet ray by the first ultraviolet irradiator (2b) (NO at step S212 illustrated in FIG. 18), but to be irradiated with ultraviolet rays by the second ultraviolet irradiator (2d) and the third ultraviolet irradiator (2c) (YES at steps S215 and 217).

In this manner, for the substrate W1 having a deep gap between the fine structures P1, power consumption is avoided at the first ultraviolet irradiator (2b) configured to emit an ultraviolet ray that is unlikely to penetrate into the gap, and intensity insufficiency in the gap between the fine structure P1 is compensated between ultraviolet rays emitted by the second ultraviolet irradiator (2d) and the third ultraviolet irradiator (2c). Accordingly, the organic substance in the gap between the fine structures can be removed in a wider range.

As illustrated in FIG. 13, the intensity of the ultraviolet ray having the third peak wavelength (λc) desirably takes a peak value in the region (Rd) having a center at the depth position (for example, 30 nm approximately) where the intensity of the ultraviolet ray having the second peak wavelength (λd) takes a bottom value, and having a width equal to half of the variation period of the ultraviolet ray. Accordingly, intensity insufficiency can be more effectively compensated between these ultraviolet rays.

<Case with Shallow Gap Between Fine Structures>

When the substrate W1 has a shallow gap (for example, 100 nm) between the fine structures P1, the selection unit 72 determines that the substrate W1 is to be irradiated with ultraviolet rays by the first ultraviolet irradiator (2b) and the second ultraviolet irradiator (2d) (YES at steps S215 and S217 illustrated in FIG. 18).

In this manner, the first ultraviolet irradiator (2b) configured to emit an ultraviolet ray that is relatively likely to penetrate into the gap is used for the substrate W1 having a shallow gap between the fine structures P1, and thus the organic substance can be more effectively removed by the ultraviolet ray having the short first peak wavelength (λb). In addition, intensity insufficiency in the gap between the fine structure P1 is compensated between the ultraviolet rays emitted by the first ultraviolet irradiator (2b) and the second ultraviolet irradiator (2d). Accordingly, the organic substance in the gap between the fine structures P1 can be removed in a wider range.

As illustrated in FIG. 23, the intensity of the ultraviolet ray having the second peak wavelength (λd) desirably takes a peak value in a region (Rb2) having a center at the depth position (for example, 30 nm approximately) where the intensity of the ultraviolet ray having the first peak wavelength (λb) takes a bottom value, and having a width equal to half of the variation period of the ultraviolet ray. This is because intensity insufficiency is more effectively compensated between these ultraviolet rays.

In this case, the third ultraviolet irradiator (2c) does not need to emit an ultraviolet ray. Accordingly, power consumption can be reduced.

As illustrated in FIG. 11, the information acquisition unit 71 acquires information (such as identification information of the substrate W1, information indicating the depth of the gap, or information indicating a processing condition on the substrate W1 in preprocessing or postprocessing by the substrate processing device 10) that changes in accordance with the depth of the gap between the fine structures P1.

The selection unit 72 selects which ultraviolet irradiator 2 is to be used based on the information. For example, the table illustrated in FIG. 26 may be stored as table information in the storage medium (for example, ROM) of the controller 7. The selection unit 72 may select which ultraviolet irradiator 2 is to be used by referring to the information acquired by the information acquisition unit 71 and the table information. Alternatively, a relational expression representing the relation between the depth of the gap and the wavelength of an ultraviolet ray may be defined to select an ultraviolet ray having a wavelength nearest to a wavelength calculated based on the relational expression.

While the invention has been shown and described in detail, the foregoing description is in all aspects illustrative and not restrictive. It is therefore understood that numerous modifications and variations can be devised without departing from the scope of the invention.

What is claimed is:

1. A substrate processing device comprising:
    a substrate holder configured to hold a substrate;
    a plurality of ultraviolet irradiators configured to irradiate each gap between a plurality of fine structures formed on said substrate held by said substrate holder with ultraviolet rays in spectra different from each other; and a controller configured to control said plurality of ultraviolet irradiators.

2. The substrate processing device according to claim 1, wherein said plurality of ultraviolet irradiators include a first ultraviolet irradiator and a second ultraviolet irradiator, and wherein an intensity of a first ultraviolet ray output from said first ultraviolet irradiator varies in a first period in a depth direction in said gap between said fine structures, an intensity of a second ultraviolet ray output from said second ultraviolet irradiator varies in a second period in said depth direction in said gap between said fine structures, and the intensity of said second ultraviolet ray reaches a peak value in a first region having a center at a position in said depth direction where the intensity of said first ultraviolet ray reaches a bottom value and having a width in said depth direction equal to half of said first period.

3. The substrate processing device according to claim 2, wherein said plurality of ultraviolet irradiators include a third ultraviolet irradiator, and wherein an intensity of a third ultraviolet ray output from said third ultraviolet irradiator varies in a third period in said depth direction in said gap between said fine structures, and the intensity of said second ultraviolet ray reaches a peak value in a region in which said first region overlaps with a second region having a center at a position in said depth direction where the intensity of said third ultraviolet ray reaches a bottom value and having a width in said depth direction equal to half of said third period.

4. The substrate processing device according to claim 1, wherein the number of said plurality of ultraviolet irradiators is three or more, and said controller includes an acquisition unit configured to acquire information that changes in accordance with at least one of a width and a depth of said gap between said fine structures, and a selector configured to perform, based on said information, a selection operation to select whether ultraviolet rays are to be emitted by two or more of said plurality of ultraviolet irradiators in accordance with the at least one of the width and the depth of said gap between said fine structures.

5. The substrate processing device according to claim 4, wherein said selector selects, based on said information, an ultraviolet irradiator configured to emit an ultraviolet ray having a shorter wavelength as said gap between said fine structures is wider or shallower.

6. The substrate processing device according to claim 5, wherein said plurality of ultraviolet irradiators include a first ultraviolet irradiator configured to emit a first ultraviolet ray in a spectrum including a first peak wavelength, and a second ultraviolet irradiator configured to emit a second ultraviolet ray in a spectrum including a second peak wavelength longer than said first peak wavelength, and wherein said selector selects said first ultraviolet irradiator and said second ultraviolet irradiator based on said information, the intensity of said first ultraviolet ray varies in a first period in said depth direction in said gap between said fine structures, and the intensity of said second ultraviolet ray takes a peak value in a region having a center at a position in said depth direction where the intensity of said first ultraviolet ray reaches a bottom value and having a width in said depth direction equal to half of said first period.

7. The substrate processing device according to claim 6, wherein said plurality of ultraviolet irradiators include a third ultraviolet irradiator configured to emit a third ultraviolet ray in a spectrum including a third peak wavelength longer than said second peak wavelength, and said selector selects, based on first information, said first ultraviolet irradiator and said second ultraviolet irradiator but not said third ultraviolet irradiator, and selects said second ultraviolet irradiator and said third ultraviolet irradiator based on second information for which said gap between said fine structures is narrower or deeper than for said first information.

8. The substrate processing device according to claim 1, wherein a distance between each plurality of ultraviolet irradiators and said substrate holder is shorter for a longer peak wavelength of an ultraviolet ray emitted by the ultraviolet irradiator.

9. The substrate processing device according to claim 1, wherein said controller controls said plurality of ultraviolet irradiators so that irradiation durations of said plurality of ultraviolet irradiators at least partially overlap with each other.

10. The substrate processing device according to claim 1, wherein said plurality of ultraviolet irradiators face the substrate held by said substrate holder with a space interposed therebetween, and said substrate processing device further includes a gas supplying unit configured to supply inert gas to said space.

11. The substrate processing device according to claim 1, wherein each plurality of ultraviolet irradiators irradiates an entire surface of the substrate held by said substrate holder with an ultraviolet ray.

12. The substrate processing device according to claim 1, further comprising a movement unit configured to move said substrate holder relative to said plurality of ultraviolet irradiators in a horizontal direction.

13. The substrate processing device according to claim 1, further comprising a rotation unit configured to rotate said substrate holder about a rotational axis orthogonal to a surface of the substrate.

14. The substrate processing device according to claim 1, wherein said fine structures have an aspect ratio of 3.5 or higher, a pitch of 50 nm or shorter, or an interval of 40 nm or shorter.

15. A substrate processing method comprising:
holding, with a substrate holder, a substrate; and
irradiating, using a plurality of ultraviolet irradiators, each gap between a plurality of fine structures formed on said substrate held by said substrate holder with ultraviolet rays in spectra different from each other.

16. An ultraviolet irradiator selecting method in a substrate processing device including a substrate holder configured to hold a substrate on which a plurality of fine structures are formed and a plurality of ultraviolet irradiators configured to irradiate each gap between said fine structures of said substrate with ultraviolet rays, the method comprising:
a first step of selecting a first ultraviolet irradiator configured to emit a first ultraviolet ray capable of penetrating into said gap between said fine structures; and
a second step of selecting a second ultraviolet irradiator configured to emit a second ultraviolet ray having a peak wavelength longer than a peak wavelength of said first ultraviolet ray and compensating intensity insufficiency in a region in which the intensity of said first ultraviolet ray is insufficient in said gap between said fine structures.

17. The ultraviolet irradiator selecting method according to claim 16, wherein
in said first step, said first ultraviolet irradiator is selected when the intensity of said first ultraviolet ray periodically varies in a depth direction in said gap between said fine structures and it is determined that a minimum peak value among at least one peak value of the intensity of said first ultraviolet ray is larger than a reference value.

18. The ultraviolet irradiator selecting method according to claim 17, wherein,
in said second step, said second ultraviolet irradiator is selected when it is determined that intensity of said second ultraviolet ray takes a peak value in a region having a center at a position in said depth direction where the intensity of said first ultraviolet ray reaches a bottom value and having a width in said depth direction equal to half of the intensity of said first ultraviolet ray.

19. The ultraviolet irradiator selecting method according to claim 18, wherein
said second ultraviolet irradiator is selected but a third ultraviolet irradiator is not selected when the intensity of said second ultraviolet ray, and intensity of a third ultraviolet ray emitted by said third ultraviolet irradiator and having a peak wavelength longer than the peak wavelength of said second ultraviolet ray both reach peak values in said region.

20. The ultraviolet irradiator selecting method according to claim 16, further comprising a third step of selecting said first ultraviolet irradiator when, in said first step, the intensity of said first ultraviolet ray monotonically decreases in said depth direction and it is determined that the intensity of said first ultraviolet ray at a predetermined depth position is larger than a reference value.

* * * * *